United States Patent
Murakami et al.

(10) Patent No.: US 7,033,848 B2
(45) Date of Patent: Apr. 25, 2006

(54) LIGHT EMITTING DEVICE AND METHOD OF MANUFACTURING THE SAME

(75) Inventors: Satoshi Murakami, Kanagawa (JP); Toru Takayama, Kanagawa (JP); Kengo Akimoto, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 11/060,763

(22) Filed: Feb. 18, 2005

(65) Prior Publication Data

US 2005/0156172 A1  Jul. 21, 2005

Related U.S. Application Data

(62) Division of application No. 10/329,953, filed on Dec. 27, 2002, now Pat. No. 6,861,710.

(30) Foreign Application Priority Data

Dec. 27, 2001 (JP) .............................. 2001-398624

(51) Int. Cl.
*H01L 21/00* (2006.01)
*H01L 21/461* (2006.01)
(52) U.S. Cl. ........................... 438/20; 438/38; 438/704
(58) Field of Classification Search .................. 438/20, 438/38, 704, 40, 149, 130
See application file for complete search history.

(56) References Cited

U.S. PATENT DOCUMENTS

| 5,952,708 | A  | 9/1999  | Yamazaki          |
|-----------|----|---------|--------------------|
| 6,175,345 | B1 | 1/2001  | Kuribayashi et al. |
| 6,274,887 | B1 | 8/2001  | Yamazaki et al.    |
| 6,426,517 | B1 | 7/2002  | Hayakawa et al.    |
| 6,432,561 | B1 | 8/2002  | Yamazaki           |
| 6,440,877 | B1 | 8/2002  | Yamazaki et al.    |
| 6,445,005 | B1 | 9/2002  | Yamazaki et al.    |
| 6,593,691 | B1 | 7/2003  | Nishi et al.       |
| 6,657,230 | B1 | 12/2003 | Murade             |
| 6,673,643 | B1 | 1/2004  | Yamazaki           |
| 6,689,492 | B1 | 2/2004  | Yamazaki et al.    |

(Continued)

FOREIGN PATENT DOCUMENTS

JP  10-189252  7/1998

*Primary Examiner*—W. David Coleman
*Assistant Examiner*—Su C. Kim
(74) *Attorney, Agent, or Firm*—Fish & Richardson P.C.

(57) ABSTRACT

A light emitting device is provided which has a structure for preventing degradation of a light emitting element due to water and oxygen contained in an interlayer insulating film formed between a TFT and the light emitting element. A TFT is formed on a substrate, an inorganic insulating film is formed on the TFT from an inorganic material and serves as a first insulating film, an organic insulating film is formed on the first insulating film from an organic material and serves as a second insulating film, and an inorganic insulating film is formed on the second insulating film from an inorganic material and serves as a third insulating film. Thus obtained is a structure for preventing the second insulating film from releasing moisture and oxygen. In order to avoid defect in forming the film, a portion of the third insulating film where a contact hole is formed is removed alone. Then, a light emitting element composed of an anode, an organic compound layer, and a cathode is formed on the third insulating film. A TFT and a light emitting element in a light emitting device of this application are connected to each other through a wire formed in a contact hole.

12 Claims, 10 Drawing Sheets

U.S. PATENT DOCUMENTS

| | | |
|---|---|---|
| 2001/0000627 A1 | 5/2001 | Hayakawa et al. |
| 2001/0004190 A1 | 6/2001 | Nishi et al. |
| 2002/0001886 A1 | 1/2002 | Ohtani |
| 2002/0048829 A1 | 4/2002 | Yamazaki et al. |
| 2002/0056842 A1 | 5/2002 | Yamazaki |
| 2002/0125817 A1 | 9/2002 | Yamazaki et al. |
| 2002/0164416 A1 | 11/2002 | Yamazaki |
| 2002/0190257 A1 | 12/2002 | Yamazaki et al. |
| 2003/0057419 A1 | 3/2003 | Murakami et al. |
| 2003/0062519 A1 | 4/2003 | Yamazaki et al. |
| 2003/0089991 A1 | 5/2003 | Yamazaki et al. |
| 2003/0094615 A1 | 5/2003 | Yamazaki et al. |
| 2003/0129790 A1 | 7/2003 | Yamazaki et al. |
| 2003/0206332 A1 | 11/2003 | Yamazaki et al. |
| 2004/0003939 A1 | 1/2004 | Nishi et al. |

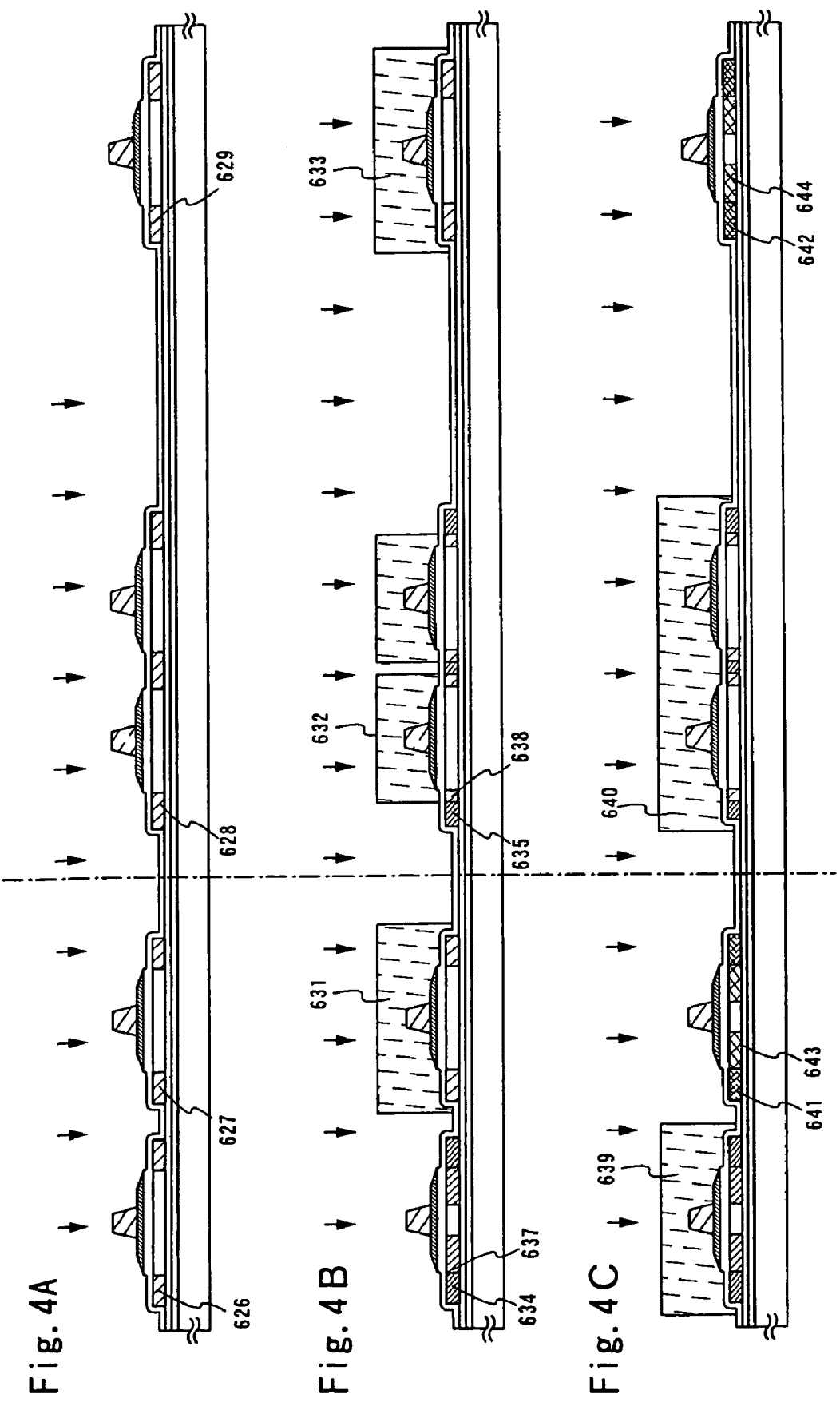

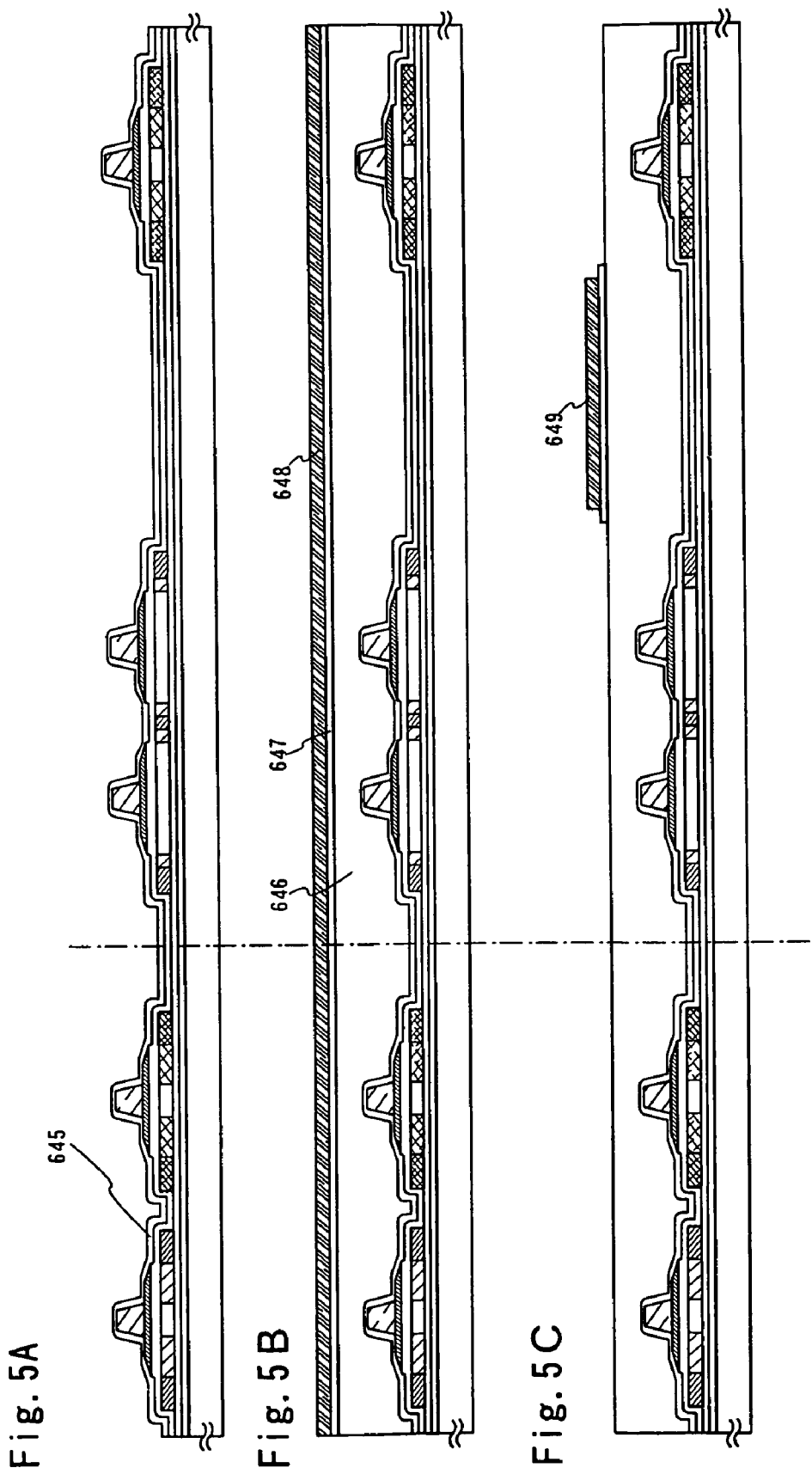

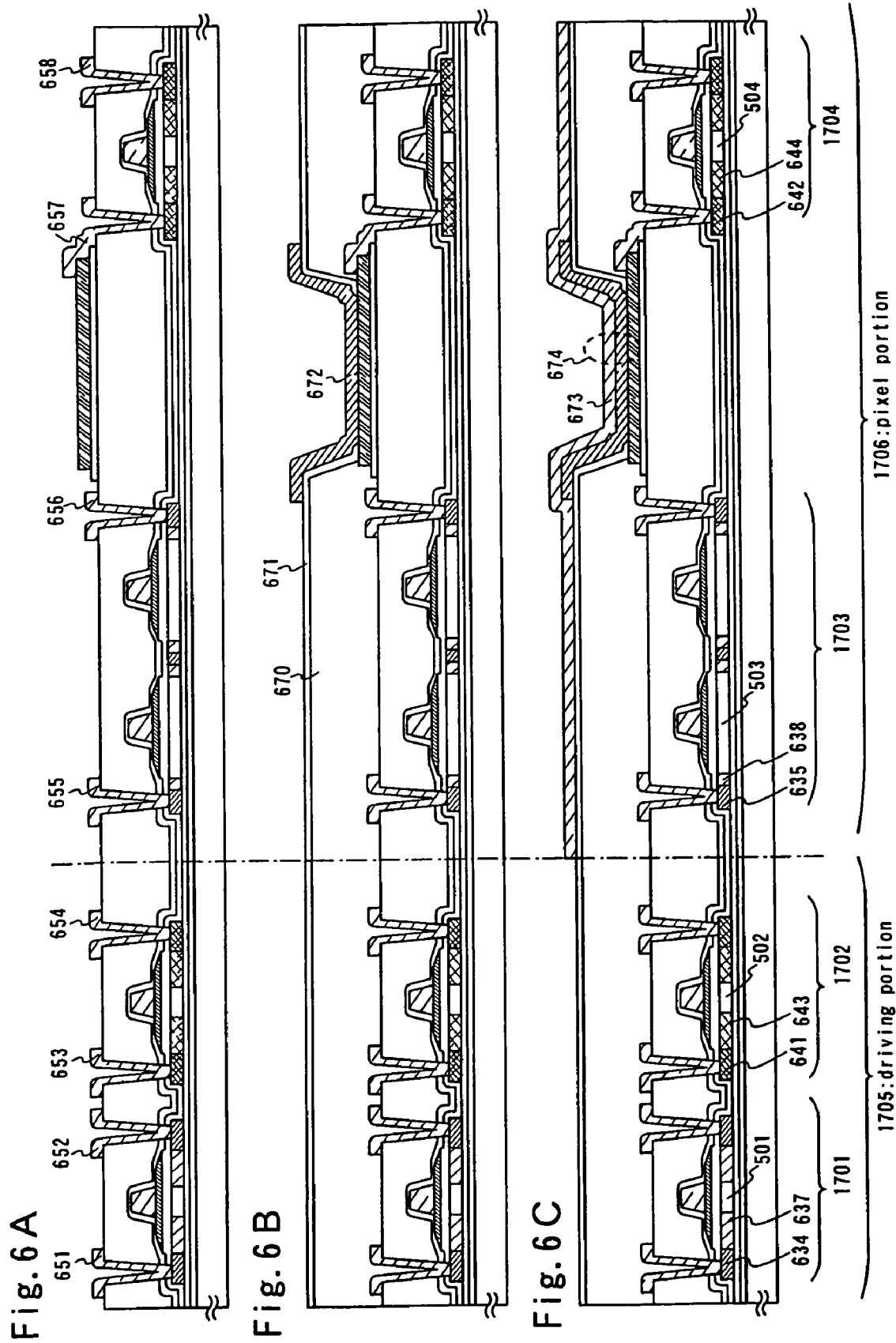

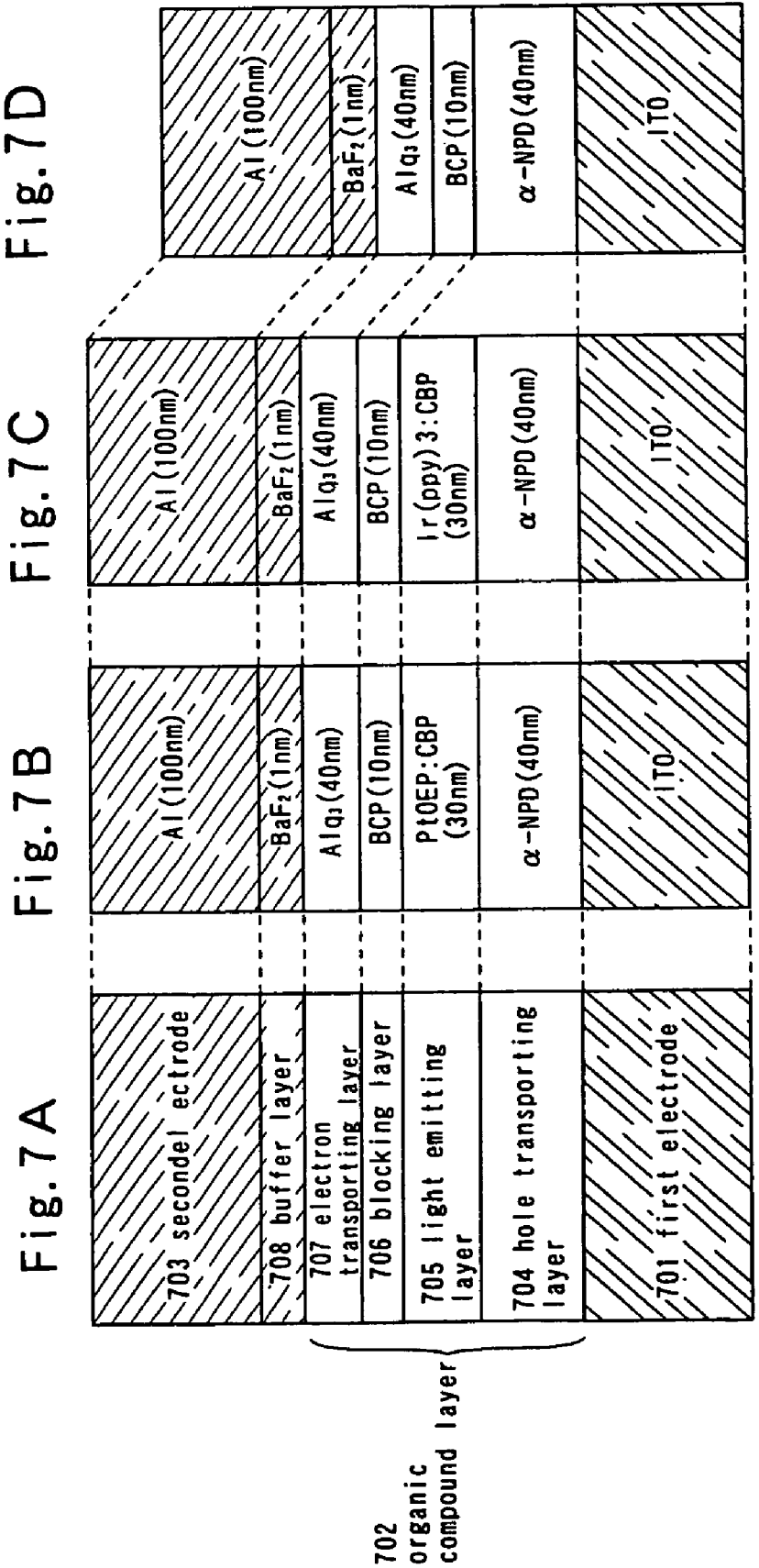

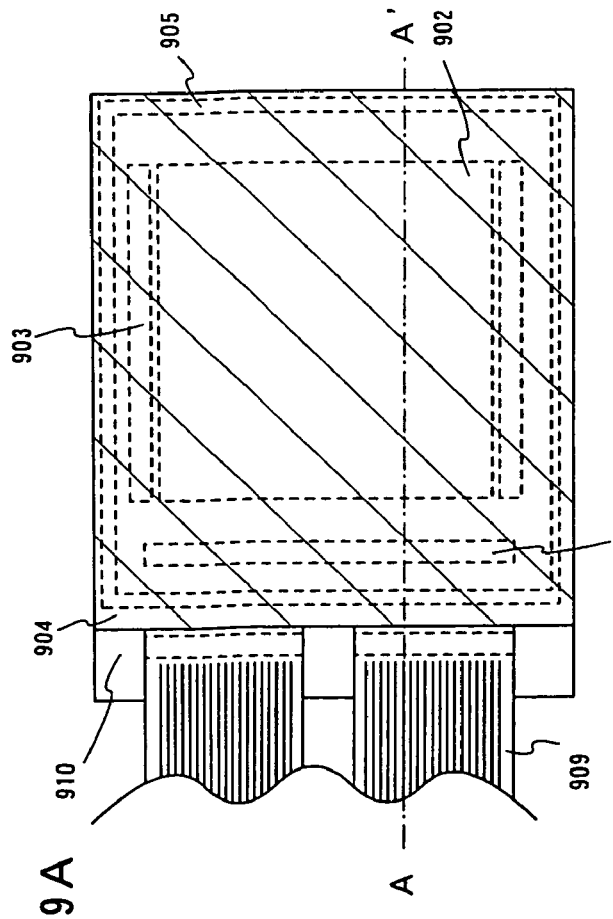
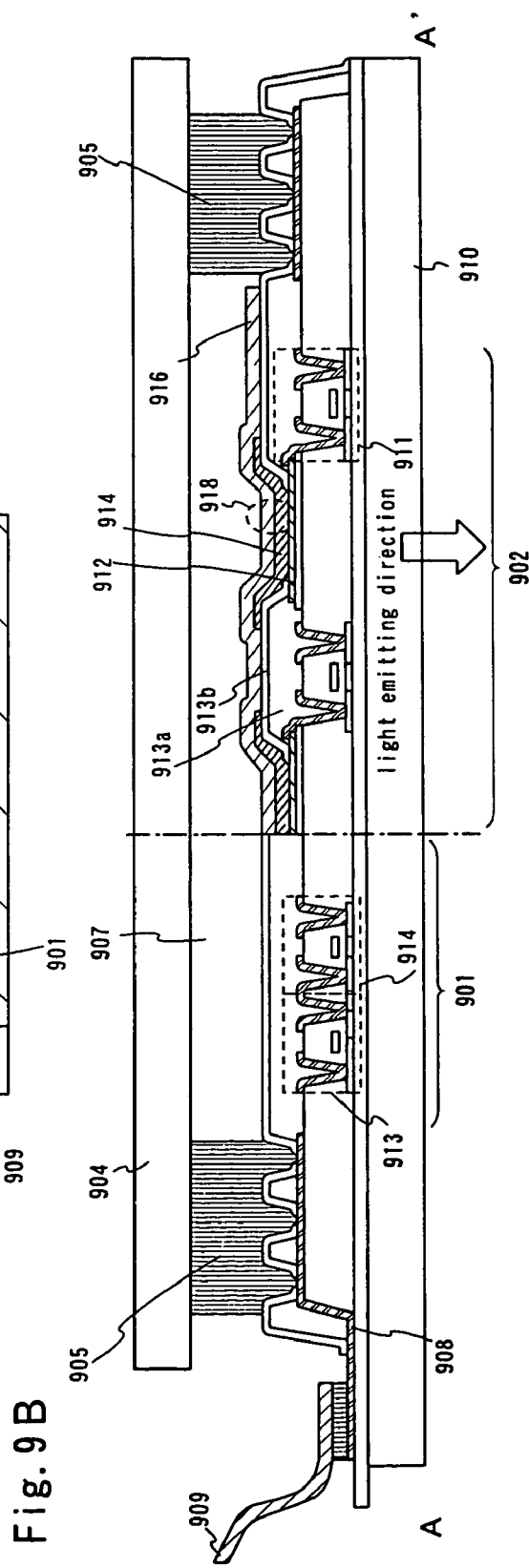
Fig. 9A
Fig. 9B

LIGHT EMITTING DEVICE AND METHOD OF MANUFACTURING THE SAME

CROSS-REFERENCE TO RELATED APPLICATIONS

This application is a divisional application of U.S. application Ser. No. 10/329,953 filed Dec. 27, 2002, now U.S. Pat. No. 6,861,710, which claims the benefit of a foreign priority application filed in Japan as Serial No. 2001-398624 on Dec. 27, 2001. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a light emitting device using a light emitting element from which florescence or phosphorescence is obtained by applying an electric field to an element having a film containing organic compound (hereinafter referred to as organic compound layer) between a pair of electrodes, and to a method of manufacturing the same. Note that the term light emitting device in this specification refers to an image display device, a light emitting device or a light source. Also included in the definition of the light emitting device are: a module in which a connector, such as an FPC (flexible printed circuit), a TAB (tape automated bonding) tape, or a TCP (tape carrier package), is attached to an organic light emitting device; a module in which a printed wiring board is provided on the tip of a TAB tape or a TCP; and a module in which an IC (integrated circuit) is mounted directly to an organic light emitting device by the COG (chip on glass) method.

2. Description of the Related Art

In recent years, a technique for forming a TFT on a substrate has progressed substantially, and application and development of active matrix type display devices is advancing. Especially, since a TFT using a polysilicon film has a field-effect mobility (also called mobility) higher than that of a TFT using a conventional amorphous silicon film, a high speed operation is possible.

Such active matrix display devices are attracting attention because, various merits such as reduction of manufacturing cost, miniaturization of a display device, improvement of a yield, and reduction of a throughput can be obtained by forming various circuits and elements on the same substrate.

Among them, in a light emitting device in which light emitting elements made from an anode, an organic compound and a cathode are arranged in a matrix form (hereinafter referred to as active matrix light emitting device), a switching element formed of a TFT (hereinafter referred to as switching TFT) is provided for each pixel, and a driving element for controlling current (hereinafter referred to as current control TFT) is operated by the switching TFT, thereby making the light emitting elements emit light.

Note that a light emitting element is an element that emits light when an electric field is applied. Light emission mechanism thereof is said to be as follows. A voltage is applied to an organic compound film sandwiched between electrodes to cause recombination of electrons injected from the cathode and holes injected from the anode in the organic compound film, and when the resultingly excited molecule (hereinafter referred to as molecular exciton) returns to base state, it releases energy in the form of light emission.

In such a light emitting element, its organic compound layer is usually formed of a thin film having a thickness of less than 1 µm. In addition, the light emitting element does not need a backlight used in conventional liquid crystal displays because it is a self-luminous element so that the organic compound layer itself emits light. The light emitting element is therefore useful in manufacturing very thin and light-weight devices, which is a great advantage.

With those features, including thinness, light-weightedness, quick response, and direct current low voltage driving, light emitting elements are attracting attention as the next-generation of flat panel display elements. In addition, since the light emitting elements are self-luminous and have a wide viewing angle, relatively satisfactory visibility is provided and they are considered as effective especially when used for display screens of electric appliance. However, the following points were problems.

Usually, at least one or two TFTs are given for each pixel on the substrate. Further, through selection of TFT, a source signal line and a gate signal line are formed in order to turn the device ON. Further, in order to insulate the TFT from light emitting elements, an interlayer insulating film which consists of insulated materials, such as silicon oxide and silicon nitride is formed on the TFT. Then, as the TFT thickness is 0.2 to 1 µm and uneven, this had to be avoided while pixel electrodes were formed. Note that in this case, since the region in which the pixel electrodes are formed is substantially made smaller, there was a problem on that the aperture ratio of a pixel portion fell.

On the contrary, JP-10-189252A discloses the following technique. There are used a polyamide coating layer formed by spin coating and a layer formed by an etch-back method after silica is subjected to polymer coating, thereby forming an interlayer insulating film on the TFT to perform leveling. Further, the light emitting element is formed thereon, thereby improving the aperture ratio of the light emitting device.

In such light emitting devices, electric connection with a TFT formed on a substrate is made through an interlayer insulating film. The interlayer insulating film is formed from an inorganic material containing silicon, such as silicon oxide, silicon nitride, and silicon oxynitride, or from an organic material such as polyimide, polyamide, acrylic, and other organic resins.

Inorganic materials have a characteristic that does not allow moisture and oxygen to transmit but have a defect of being cracked when they are formed into thick films.

In contrast, organic materials can be formed into thick films and the surfaces of the films are fairly level. Accordingly, a film formed from an organic material is suitable as a film to level the surface above a TFT. However, organic materials also have disadvantages such as being transmissive of oxygen and transmissive or absorptive of moisture.

An organic compound layer constituting a light emitting element is very weak against oxygen and moisture and is easily degraded. Oxygen and moisture cause degradation of a light emitting element and accordingly cause dark spot or other degradation of a light emitting device.

When a second interlayer insulating film formed of an organic material and a third interlayer insulating film formed of an inorganic material are layered, there is a technical difficulty in patterning the laminate. Specifically, the third interlayer insulating film peels off (peeling) at an edge of a contact hole where a first interlayer insulating film and the second interlayer insulating film overlap and are exposed in section. The contact hole is formed in the laminate in order to form a wire for connecting the TFT with an electrode of the light emitting element.

SUMMARY OF THE INVENTION

The present invention has been made in view of the above, and objects of the present invention are therefore to provide a structure for preventing degradation of a light emitting element due to moisture and oxygen contained in an interlayer insulating film that is formed between a TFT and the light emitting element and to solve the problem that arises when an insulating film formed of an inorganic material and an insulating film formed of an organic material are layered.

The present invention is characterized in that a TFT is formed on a substrate, an inorganic insulating film is formed on the TFT from an inorganic material and serves as a first insulating film, an organic insulating film is formed on the first insulating film from an organic material and serves as a second insulating film, an inorganic insulating film is formed on the second insulating film from an inorganic material and serves as a third insulating film, and a light emitting element composed of an anode, an organic compound layer, and a cathode is formed on the third insulating film.

The present invention is characterized by being structured such that a second insulating film and a third insulating film are layered to prevent the second insulating film from releasing its moisture and oxygen and that no third insulating film is formed in a portion where a contact hole is formed.

Specifically, the above structure is obtained as follows: a first insulating film, a second insulating film, and a third insulating film are layered, a conductive film for a first electrode of a light emitting element is formed, the conductive film is patterned to form the first electrode while at the same time the third insulating film is partially etched, and a contact hole is formed in the second insulating film whose surface has been exposed by etching, in the first insulating film, and in a gate insulating film.

A structure of the present invention disclosed herein is a light emitting device having: a TFT formed on an insulating surface; a first insulating film formed on the TFT from an inorganic material; a second insulating film formed on the first insulating film from an organic material; and a light emitting element composed of a first electrode, an organic compound layer, and a second electrode, the device characterized in that a third insulating film is formed from an inorganic material and is positioned so as to overlap the first electrode.

Also, according to another structure of the present invention, there is provided a light emitting device including: a TFT formed on an insulating surface; a first insulating film formed on the TFT from an inorganic material; a second insulating film formed on the first insulating film from an organic material; a contact hole formed in the first insulating film and the second insulating film; a light emitting element composed of a first electrode, an organic compound layer, and a second electrode; and a third insulating film formed from an inorganic material between the second insulating film and the first electrode while overlapping the first electrode, in which the TFT is electrically connected to the first electrode through a wire that is formed in the contact hole.

Also, according to another structure of the present invention, there is provided a light emitting device including: a TFT formed on an insulating surface; a first insulating film formed on the TFT from an inorganic material; a second insulating film formed on the first insulating film from an organic material; a contact hole formed in a gate insulating film of the TFT, the first insulating film, and the second insulating film; a light emitting element composed of a first electrode, an organic compound layer, and a second electrode; and a third insulating film formed from an inorganic material between the second insulating film and the first electrode while overlapping the first electrode, in which a wire is formed in the contact hole and comes into contact with the first insulating film, the second insulating film, and the gate insulating film, and in which the wire electrically connects the TFT with the first electrode.

In the above structures, employable inorganic materials are a silicon oxynitride film and a silicon nitride film and, desirably, the silicon content ratio thereof is 25.0 atomic % or higher and 35.0 atomic % or lower and the nitrogen content ratio thereof is 35.0 atomic % or higher and 65.0 atomic % or lower. A silicon oxide film may also be used but a silicon oxynitride film or a silicon nitride film is preferred taking into consideration the ability of blocking an alkaline metal and the like.

In the above structures, employable organic materials are thermally-curable or photo-curable organic resin materials, such as acrylic, polyimide, polyamide, polyimideamide, and BCB (benzocyclobutene).

Also, according to another structure of the present invention, there is provided a method of manufacturing a light emitting device, including: forming a TFT on an insulating surface; forming a first insulating film on the TFT from an inorganic material; forming a second insulating film on the first insulating film by application from an organic material; forming a third insulating film on the second insulating film by sputtering from an inorganic material; forming a conducting film on the third insulating film, the conductive film serving as a first electrode of a light emitting element; forming the first electrode from the conductive film by first etching using a mask; and removing the third insulating film by second etching except an area that overlaps the first electrode.

Further, according to another structure of the present invention, there is provided a method of manufacturing a light emitting device, including: forming a TFT on an insulating surface; forming a first insulating film on the TFT from an inorganic material; forming a second insulating film on the first insulating film by application from an organic material; forming a third insulating film on the second insulating film by sputtering from an inorganic material; forming a conducting film on the third insulating film, the conductive film serving as a first electrode of a light emitting element; forming the first electrode from the conductive film by first etching using a mask; removing the third insulating film by second etching except an area that overlaps the first electrode; forming a contact hole in the first insulating film, the second insulating film, and a gate insulating film of the TFT; forming a wire in the contact hole; bringing the wire into contact with the TFT and the first electrode; forming an organic compound layer on the first electrode; and forming a second electrode of the light emitting element on the organic compound layer.

In the above structures, an inorganic material is formed into a film by vapor-phase film formation methods such as sputtering, reactive sputtering, ion beam sputtering, ECR (electron cyclotron resonance) sputtering, and ion evaporation. These film formation methods are to make an atom or molecule adhere onto a substrate physically. Therefore the atom or molecule hardly reacts with the interlayer insulating film previously formed from an organic material, and the methods have no fear of transforming the atom or molecule chemically. In addition, the methods are characterized in that a dense film can be formed even when the temperature ranges between room temperature and 300° C. The film has a characteristic of preventing transmission of oxygen and moisture.

If one of the sputtering methods given in the above is used, an inorganic insulating film which has satisfactory light transmittance and which mainly contains silicon or nitrogen can be formed at a substrate temperature ranging from room temperature to 300° C. The inorganic insulating film is interposed between an interlayer insulating film formed of an organic material and a light emitting element that is composed of an anode, a cathode, and an organic compound layer. This prevents the interlayer insulating film formed of an organic material from releasing oxygen and moisture and therefore degradation of the light emitting element can be avoided.

When the inorganic insulating film mainly containing silicon and nitrogen is formed by sputtering, a target mainly containing silicon is used and argon, nitrogen, oxygen, or nitrogen oxide is employed as sputtering gas. The composition ratio of nitrogen and oxygen in the inorganic insulating film mainly containing silicon and nitrogen varies depending on the gas flow rate during film formation. In this specification, a film having nitrogen as the main ingredient other than silicon in the composition ratio is called a silicon nitride film whereas a film having oxygen and nitrogen as the main ingredients other than silicon in the composition ratio is called a silicon oxynitride film.

If the inorganic insulating film mainly containing silicon and nitrogen is formed by one of the above sputtering methods using silicon as the target and gas that contains noble gas and nitrogen, the film obtained can have a silicon content ratio of 25.0 atomic % or higher and 35.0 atomic % or lower and a nitrogen content ratio of 35.0 atomic % or higher and 65.0 atomic % or lower.

The above process does not include heating a substrate at 300° C. or higher. Therefore, the process is also applicable to cases where a TFT is formed on a resin substrate or a flexible (plastic) substrate.

In the above structures, an inorganic insulating film is formed from an inorganic material, a transparent conductive film is formed on the inorganic insulating film, a mask is formed by photolithography, and the transparent conductive film is subjected to first etching to form a first electrode. The first etching is followed by second etching without removing the mask, thereby etching a portion of the inorganic insulating film that does not overlap the mask. There are two types of etching methods: wet etching and dry etching. In the present invention, the first etching uses wet etching and the second etching uses dry etching.

Light emission obtained from a light emitting device of the present invention is light emission from singlet excitation or light emission from triplet excitation, or both.

BRIEF DESCRIPTION OF THE DRAWINGS

In the accompanying drawings:

FIGS. 4A to 4C are diagrams illustrating an element structure in a light emitting device of the present invention;

FIGS. 5A to 5C are diagrams illustrating a process of manufacturing a light emitting device of the present invention;

FIGS. 6A to 6C are diagrams illustrating a process of manufacturing a light emitting device of the present invention;

FIGS. 7A to 7D are diagrams illustrating an element structure in a light emitting device of the present invention;

FIGS. 9A and 9B are diagrams illustrating the exterior of a light emitting device of the present invention.

DETAILED DESCRIPTION OF THE PREFERRED EMBODIMENTS

Embodiment 1

Figure 1:
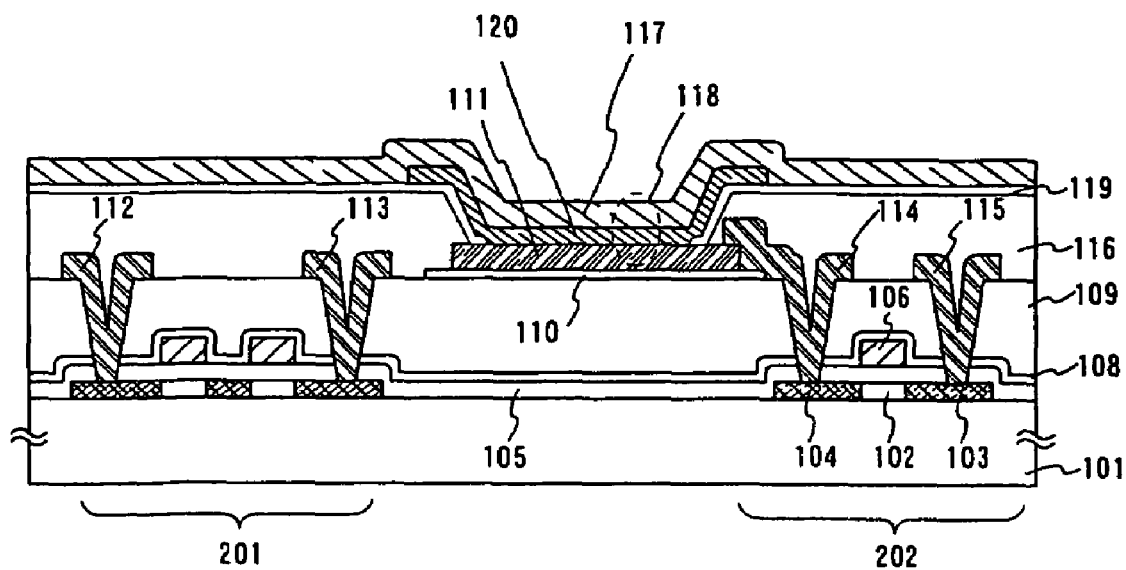
FIG. 1 is a diagram illustrating an element structure in a light emitting device of the present invention.

An embodiment of the present invention is described with reference to FIG. 1. FIG. 1 shows the sectional structure of a light emitting element formed in a pixel portion of a light emitting device in the present invention. In the description here, the light emitting element is of downward emission type and light generated in its organic compound layer is taken out from the substrate side (from the side of a first electrode described later).

In FIG. 1, thin film transistors (TFTs) are formed on a substrate 101. The TFTs shown here are a current controlling TFT 202 and a switching TFT 201. The current controlling TFT 202 is electrically connected to a first electrode 111 of a light emitting element 118 and has a function of controlling the current supplied to the light emitting element 118. The switching TFT 201 is for controlling a video signal applied to a gate electrode 106 of the current controlling TFT 202. In this embodiment, the current controlling TFT 202 is a p-channel TFT and the switching TFT 201 is an n-channel TFT.

The substrate 101 has to be transmissive of light and thereby a glass substrate is used. A quartz substrate, a resin substrate, or a flexible (plastic) substrate material may be used instead. The TFTs each have an active layer, which has at least a channel formation region 102, a source region 103, and a drain region 104.

The active layer of each TFT is covered with a gate insulating film 105. A gate electrode 106 overlaps the channel formation region 102 with the gate insulating film 105 sandwiched therebetween. The gate electrode 106 is covered with a first interlayer insulating film 108. A second interlayer insulating film 109 is formed on the first interlayer insulating film 108. A third interlayer insulating film 110 is formed on the second interlayer insulating film 109.

The first interlayer insulating film 108 is formed from an inorganic material containing silicon, such as silicon oxide, silicon nitride, silicon oxynitride, or an applied silicon oxide film (SOG: Spin On Glass). The second interlayer insulating film 109 is formed from an organic material such as polyimide, polyamide, acrylic (including photosensitive acrylic), or BCB (benzocyclobutene). The third interlayer insulating film 110 is formed from an inorganic material containing silicon, such as silicon oxide, silicon nitride, silicon oxynitride, or SOG.

After the third interlayer insulating film 110 is formed, a transparent conductive film is formed and patterned to form the first electrode 111 that is an electrode through which light is taken out.

In this embodiment, the first electrode 111 functions as an anode. Therefore the transparent conductive film used here is formed from a material having a large work function, 4.5 eV or more. Specifically, a light-transmissive conductive film such as an indium oxide-tin (ITO: indium tin oxide) film or an indium zinc oxide (IZO) film obtained by mixing 2 to 20% of zinc oxide (ZnO) with indium oxide can be employed. Long period elements belonging to Groups 3 to 11 in the periodic table, such as gold (Au), platinum (Pt), Nickel (Ni), tungsten (W), and titanium (Ti), can also be employed as conductive materials.

On the other hand, if a second electrode formed later serves as an electrode through which light is taken out, the first electrode 111 is formed from a light-transmissive anode material. In this case, long period elements belonging to Groups 3 to 11 in the periodic table, such as gold (Au), platinum (Pt), Nickel (Ni), tungsten (W), and titanium (Ti), are formed into a film whose thickness is set to obtain 10% or less transmittance for visible light.

Figure 2A:
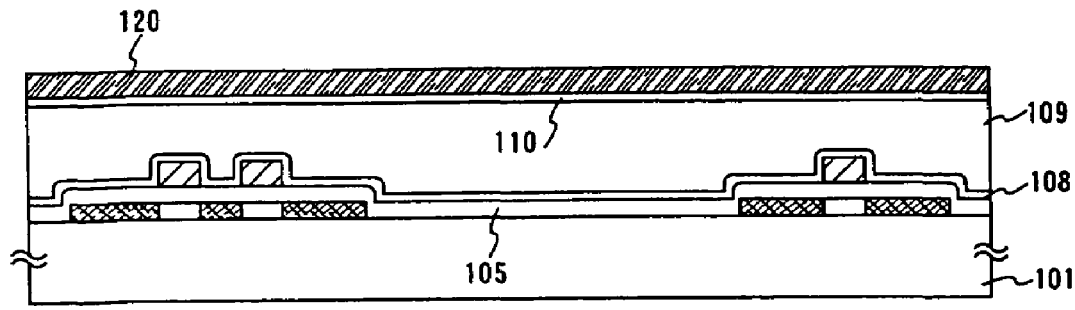
FIGS. 2A to 2D are diagrams illustrating an element structure in a light emitting device of the present invention.

The third interlayer insulating film 110 and the transparent conductive film 120 are now finished and the device at this point is shown in FIG. 2A. Components in FIG. 2A that are identical with those in FIG. 1 are denoted by the same symbols.

Figure 2B:
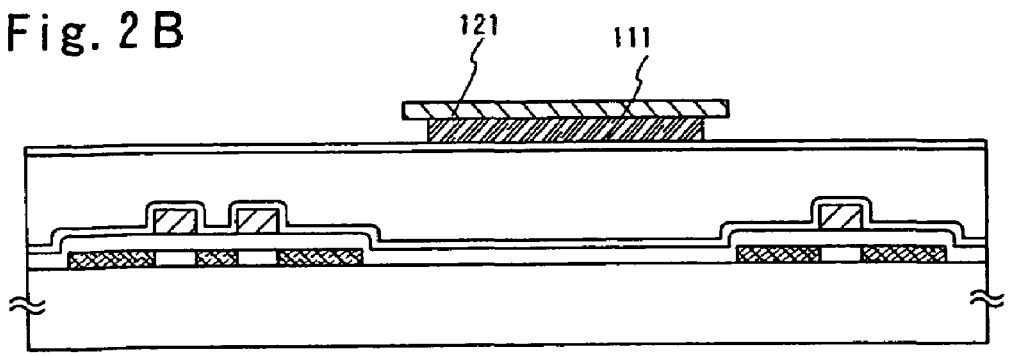

On the transparent conductive film 120, a mask 121 is formed by photolithography to etch the transparent conductive film 120. Wet etching is used for etching of the transparent conductive film 120. As a result, the first electrode 111 is formed by patterning (FIG. 2B).

Figure 2C:
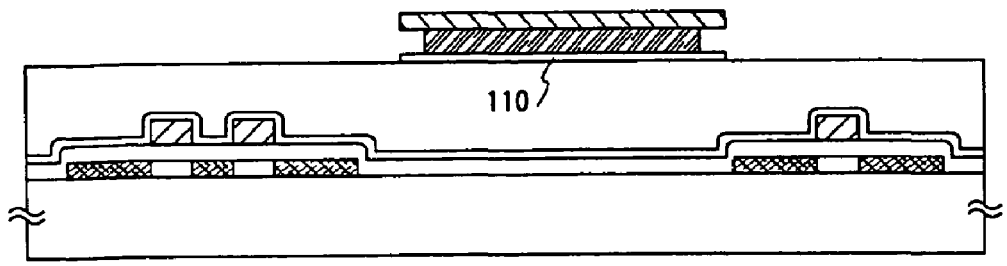

Without removing the mask 121, the third interlayer insulating film 110 is etched by dry etching. In this etching, a portion of the third interlayer insulating film 110 that is covered with the mask 121 and that overlaps the first electrode 111 is not etched and left whereas the rest of the third interlayer insulating film 110 is etched away (FIG. 2C).

Figure 2D:
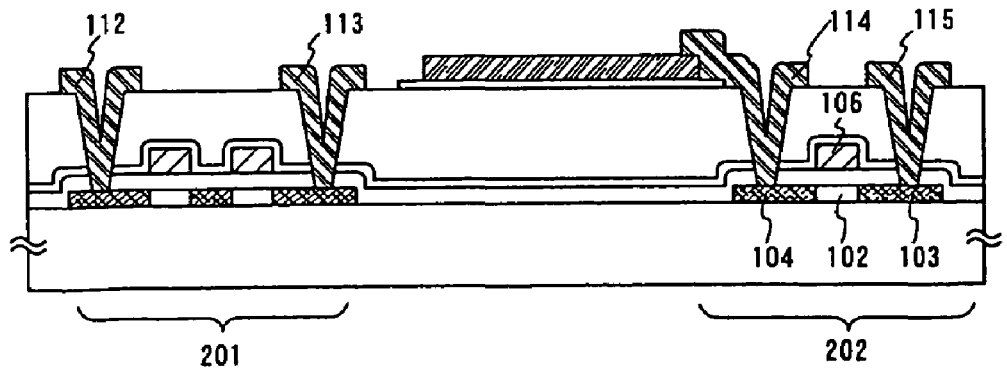

The mask 121 is removed and then contact holes reaching the source or drain of the TFTs are formed in the second interlayer insulating film 109, the first interlayer insulating film 108, and the gate insulating film 105. After the contact holes are formed, wires 112 to 115 are formed and electrically connected to the source regions or drain regions of the TFTs (FIG. 2D).

The third interlayer insulating film 110 structured as shown in FIG. 1 is formed between the second interlayer insulating film 109 and the first electrode 111 through these steps. In this way, the third interlayer insulating film 110 formed of an inorganic material prevents the second interlayer insulating film 109 formed of an organic material from releasing moisture and oxygen to the light emitting element 118 side. In addition, the contact holes reaching the source regions or drain regions of the TFTs are formed in portions of the first interlayer insulating film and second interlayer insulating film from which the third interlayer insulating film has been removed. Accordingly, the problem of peeling, which is caused by forming a contact hole in a laminate portion of a second interlayer insulating film and a third interlayer insulating film, can be avoided.

The first electrode 111 is connected to a drain region 104 of the current controlling TFT 202 through the wire 114. The luminance of light emitted from the light emitting element 118 is controlled by the level of current supplied from the current controlling TFT 202 to the first electrode 111.

As shown in FIG. 1, the ends of the first electrode 111 and the wires (112 to 115) are covered with an insulating layer 116. The insulating layer 116 is formed from an inorganic material containing silicon, such as silicon oxide, silicon nitride, silicon oxynitride, or an applied silicon oxide film (SOG: Spin On Glass), or an organic material such as polyimide, polyamide, acrylic (including photosensitive acrylic), or BCB (benzocyclobutene). The thickness of the insulating layer 116 is set to 0.1 to 2 μm. In particular, when formed from a material containing silicon, such as silicon oxide, silicon nitride, or silicon oxynitride, the insulating layer 116 desirably has a thickness of 0.1 to 0.3 μm.

An opening positioned so as to overlap the first electrode 111 is formed in the insulating layer 116, thereby obtaining an insulating layer 119.

An organic compound layer 120 is formed on the first electrode (anode) 111. The first electrode 111, the organic compound layer 120, and a second electrode (cathode) 117 that is formed on the organic compound layer 120 constitute the light emitting element 118. The material of the organic compound layer 120 may be a low-molecular weight material or a high-molecular weight material. The second electrode (cathode) 117 is formed from a material having a small work function (specifically, 3.8 eV or less). An element belonging to Group 1 or 2 of the periodic table, namely, an alkaline metal, an alkaline earth metal, an alloy or compound containing those metals, or a transitional metal including a rare-earth metal can be employed for the second electrode 117. The second electrode (cathode) 117 is formed by evaporation or sputtering.

In Embodiment 1, the first electrode 111 is formed from a transparent conductive film to serve as an anode and therefore light generated by recombination of carriers in the organic compound layer 120 is emitted from the first electrode 111 side. The second electrode 117 is desirably formed of a light-shielding material.

In this embodiment, a buffer layer (not shown in the drawing) is provided in the interface between the organic compound layer 120 and the second electrode 117. The material of the buffer layer can be barium fluoride ($BaF_2$), calcium fluoride ($CaF_2$), cesium fluoride (CsF), or the like. The thickness of the buffer layer has to be about 1 nm. Other materials that can be used for the buffer layer include cesium (Cs), barium (Ba), calcium (Ca), a magnesium alloy (Mg: Ag), and lanthanoids. The buffer layer here is formed from barium fluoride ($BaF_2$) to a thickness of 1 nm. On the buffer layer, an Al film is formed to a thickness of 100 nm as the second electrode 117. In this embodiment, the buffer layer is included in the second electrode 117.

Through the above process, a light emitting device having the first electrode 111, the organic compound layer 120, and the second electrode 117 is obtained.

Embodiment 2

Embodiment 2 describes in detail a method of manufacturing a pixel portion and TFTs (an n-channel TFT and a p-channel TFT) of a driving circuit provided in the periphery of the pixel portion on the same substrate at the same time. The description is given with reference to FIGS. 3A to 6C.

First, a base insulating film 601 is formed on a substrate 600. After a first semiconductor film having a crystal structure is obtained, the film is etched into desired shapes to form semiconductor layers 602 to 605 that are separated from one another like islands.

The substrate 600 is a glass substrate, a quartz substrate, or a ceramic substrate. For the base insulating film 601, a silicon oxynitride film 601a with a thickness of 50 nm (preferably 10 to 200 nm) is formed by plasma CVD at 400° C. using SiH$_4$, NH$_3$, and N$_2$O as material gas. Next, a silicon oxynitride film 601b with a thickness of 100 nm (preferably 50 to 200 nm) is formed by plasma CVD at 400° C. using SiH$_4$ and N$_2$O as material gas and laid on 601a. Then a semiconductor film having an amorphous structure (here an amorphous silicon film) is formed by plasma CVD at 300° C. using SiH$_4$ as material gas to a thickness of 54 nm (preferably 25 to 80 nm).

The base film 601 in this embodiment has a two-layer structure but it may be a single layer or two or more layers of the above insulating films. The material of the semiconductor film is not limited but silicon, a silicon germanium (Si$_x$Ge$_{1-x}$ (X=0.0001 to 0.02)) alloy, or the like is preferred and these may be formed into a film by a known method (sputtering, LPCVD, plasma CVD, or the like).

Next, the semiconductor film having an amorphous structure is crystallized to obtain a semiconductor film having a crystal structure. Crystallization here can employ a known crystallization technique such as a solid-phase growth method or laser crystallization.

If laser crystallization is employed, a pulse oscillation type or continuous wave excimer laser, YAG laser, YVO$_4$ laser, or YLF laser can be used. The second to fourth harmonic of a YAG laser, YVO$_4$ laser, or YLF laser is utilized. In this case, laser light emitted from the laser oscillator is collected by an optical system into a linear beam before it irradiates the semiconductor film. Crystallization conditions can be set to suit individual cases.

In another crystallization method, the semiconductor film before crystallization is doped with nickel or other metal elements having a catalytic function over crystallization of a semiconductor. For instance, a solution containing nickel is held to the top face of the amorphous silicon film, the amorphous silicon film is subjected to dehydrogenation (at 500° C. for an hour) and then thermal crystallization (at 550° C. for four hours), and the film is then irradiated with the second harmonic of a continuous wave laser selected from a YAG laser, a YVO$_4$ laser, and a YLF laser to improve its crystallinity.

Next, a resist mask is formed on the surface of the obtained silicon film with a crystal structure (also called a polysilicon film). The silicon film is etched into desired shapes to form the semiconductor layers 602 to 605 that are separated from one another like islands. After the semiconductor layers are formed, the resist mask is removed.

The obtained semiconductor layers may be doped with an impurity element that give the p type or n type conductivity in order to control the threshold (Vth) of the TFTs. Impurity elements known to give the p type conductivity to a semiconductor are Group 13 elements in the periodic table, such as boron (B), aluminum (Al), and gallium (Ga). Impurity elements known to give the n type conductivity to a semiconductor are Group 15 elements in the periodic table, typically, phosphorus (P) or arsenic (As).

Next, a gate insulating film 607 is formed to cover the semiconductor layers 602 to 605. The gate insulating film 607 is an insulating film containing silicon and is formed by plasma CVD or sputtering from an inorganic insulating material such as silicon oxide or silicon oxynitride to a thickness of 40 to 150 nm. The gate insulating film may be a single layer or laminate of insulating films containing silicon.

Figure 3A:
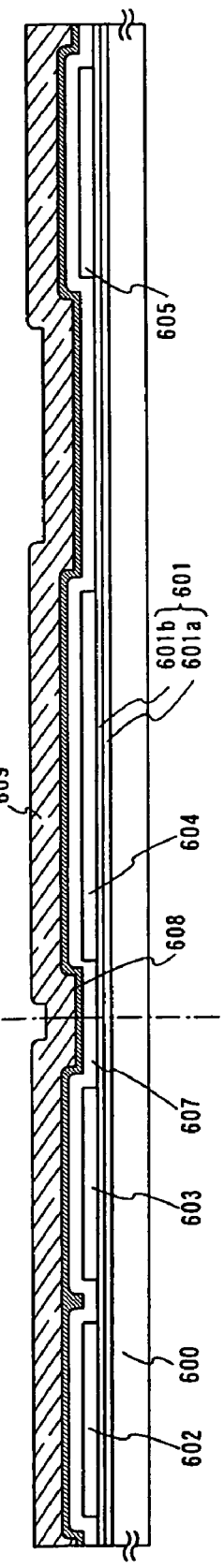
FIGS. 3A to 3C are diagrams illustrating an element structure in a light emitting device of the present invention.

Next, as shown in FIG. 3A, a first conductive film 608 with a thickness of 20 to 100 nm and a second conductive film 609 with a thickness of 100 to 400 nm are layered on the gate insulating film 607. In this embodiment, a tantalum nitride film with a thickness of 30 nm and a tungsten film with a thickness of 370 nm are layered sequentially on the gate insulating film 607.

The conductive material of the first conductive film and second conductive film can be an element selected from the group consisting of Ta, W, Ti, Mo, Al, and Cu, or an alloy or compound mainly containing the above-mentioned elements. Alternatively, the first conductive film and the second conductive film may be semiconductor films, typically polycrystalline silicon films, doped with phosphorus or other impurities, or may be Ag—Pd—Cu alloy films.

Figure 3B:
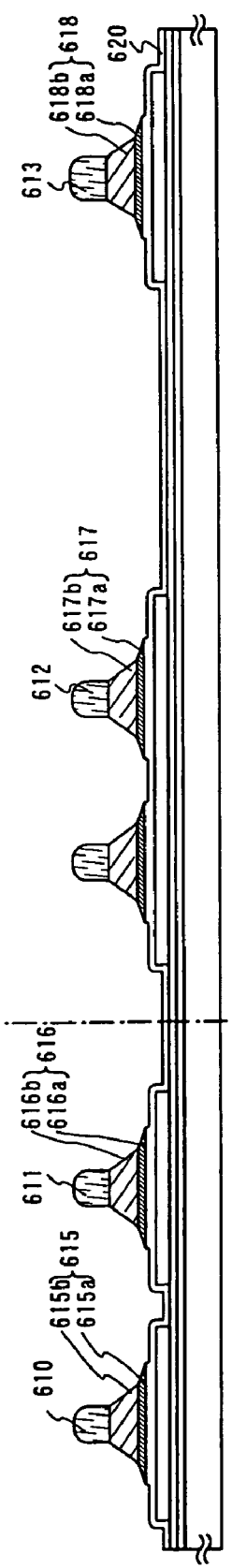
Figure 3C:
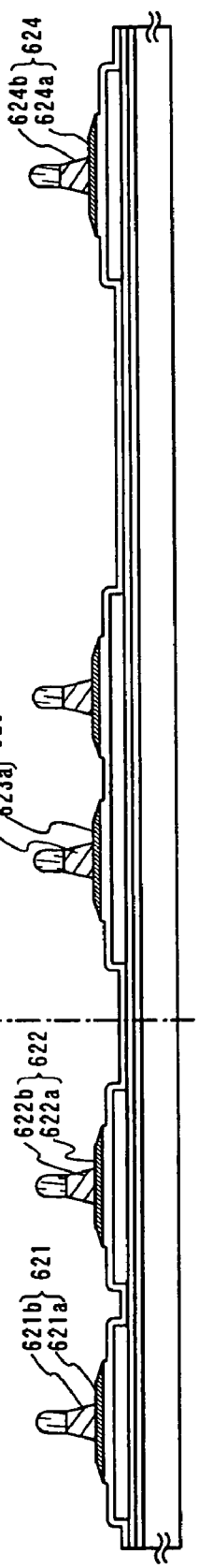

Next, resist masks 610 to 613 are formed by a light exposure process as shown in FIG. 3B. Then first etching treatment is conducted for forming gate electrodes and wires. The first etching treatment employs first and second etching conditions. ICP (inductively coupled plasma) etching is preferred for the etching. The films can be etched to have desired taper shapes by using ICP etching and suitably adjusting the etching conditions (the amount of power applied to a coiled electrode, the amount of power applied to an electrode on the substrate side, the temperature of the electrode on the substrate side, etc.). For etching gas, a suitable one can be chosen from chlorine-based gas, typically, Cl$_2$, BCl$_3$, SiCl$_4$, or CCl$_4$, fluorine-based gas, typically, CF$_4$, SF$_6$, or NF$_3$, and O$_2$.

In this embodiment, the substrate side (sample stage) also receives an RF (13.56 MHz) power of 150 W to apply a substantially negative self-bias voltage. The area of the substrate-side electrode is 12.5 cm×12.5 cm. The coiled electrode (here, a quartz disc provided with a coil) is a disc having a diameter of 25 cm.

The first etching conditions in this embodiment include employing ICP (inductively coupled plasma) etching, using CF$_4$, Cl$_2$, and O$_2$ as etching gas, setting the gas flow rate ratio thereof to 25:25:10 (sccm), and applying an RF (13.56 MHz) power of 500 W to a coiled electrode at a pressure of 1 Pa to generate plasma for etching. The substrate side (sample stage) also receives an RF (13.56 MHz) power of 150 W to apply a substantially negative self-bias voltage. The W film is etched under these first etching conditions to taper the first conductive layer around the edges.

Thereafter the first etching conditions are switched to the second etching conditions without removing the resist masks 610 to 613. The second etching conditions include using CF$_4$ and Cl$_2$ as etching gas, setting the gas flow rate ratio thereof to 30:30 (sccm), and giving an RF (13.56 MHz) power of 500 W to a coiled electrode at a pressure of 1 Pa to generate plasma for etching for about 30 seconds. The substrate side (sample stage) also receives an RF power (13.56 MHz) of 20 W to apply a substantially negative self-bias voltage. Under the second etching conditions where a mixture of CF$_4$ and Cl$_2$ is used, the W film and the TaN film are etched to the same degree.

Through the first etching treatment, first shape conductive layers 615 to 618 consisting of the first conductive layer and the second conductive layer (first conductive layers 615a to 618a and second conductive layers 615b to 618b) are formed. The insulating film 607 serving as the gate insulating film is etched by 10 to 20 nm. Thus obtained is a gate insulating film 620 in which regions that are not covered with the first shape conductive layers 615 to 618 are thinned.

Next follows the second etching treatment with the resist masks kept in place. Here, SF$_6$, Cl$_2$ and O$_2$ are used as etching gas to etch the W film selectively. The gas flow rate ratio thereof is set to 24:12:24 (sccm), and an RF (13.56 MHz) power of 700 W is given to a coiled electrode at a pressure of 1.3 Pa to generate plasma for etching. The substrate side (sample stage) also receives an RF power (13.56 MHz) of 10 W to apply a substantially negative self-bias voltage.

Second conductive layers 621b to 624b are formed through the second etching treatment. On the other hand, the first conductive layers are hardly etched in this treatment and become first conductive layers 621a to 624a. The first conductive layers 621a to 624a and the first conductive layers 615a to 618a have almost the same size.

The resist masks are removed and then the first doping treatment is conducted to obtain the state of FIG. 4A. The doping treatment employs ion doping or ion implantation. The ion doping conditions include setting the dose to $6.0\times10^{13}$ atoms/cm$^2$ and the acceleration voltage to 60 to 100 keV. As an impurity element that gives the n type conductivity, typically, phosphorus (P) or arsenic (As) is used. In this case, the first and second conductive layers 621 to 624 serve as masks against the impurity element that gives the n type conductivity and first impurity regions 626 to 629 are formed in a self-aligning manner. The first impurity regions 626 to 629 are doped with the impurity element that gives the n type conductivity in a concentration of $1\times10^{16}$ to $1\times10^{17}$/cm$^3$. Here, a region having the same concentration range as the first impurity regions is called an n$^-$ region.

Next, as shown in FIG. 4B, resist masks 631 to 633 are formed for the second doping treatment. The mask 631 is to protect a channel formation region and surrounding regions of a semiconductor layer for forming the p-channel TFT of the driving circuit. The mask 632 is to protect a channel formation region and surrounding regions of a semiconductor layer for forming a TFT of the pixel portion.

The ion doping conditions in the second doping treatment include setting the dose to $3.0\times10^{15}$ atoms/cm$^2$ and the acceleration voltage to 60 to 100 keV In the second doping treatment, impurity regions are formed in the semiconductor layers in a self-aligning manner with the second conductive layer 621b as a mask. It is certain that the regions covered with the masks 631 to 633 are not doped with the impurity element. In this way, second impurity regions 634 and 635 and a third impurity region 637 are formed. The second impurity regions 634 and 635 are doped with the impurity element that gives the n type conductivity in a concentration of $1\times10^{20}$ to $1\times10^{21}$/cm$^3$. Here, a region having the same concentration range as the second impurity regions is called an n$^+$ region.

The impurity concentration in the third impurity region is lower than in the second impurity regions because of the first conductive layers. The third impurity region is doped with the impurity element that gives the n type conductivity in a concentration of $1\times10^{18}$ to $1\times10^{19}$/cm$^3$. Since the third impurity region is doped through the tapered portions of the first conductive layers, it has a concentration gradient that increases the impurity concentration toward the edges of the tapered portions. Here, a region having the same concentration range as the third impurity region is called an n$^-$ region. The region that is covered with the mask 632 is not doped with the impurity element and becomes a first impurity region 638.

The resist masks 631 to 633 are removed and new resist masks 639 and 640 are formed as shown in FIG. 4C for the third doping treatment.

Through the third doping treatment, fourth impurity regions 641 and 642 and fifth impurity regions 643 and 644 doped with an impurity element that gives the p type conductivity are formed in the semiconductor layer for forming the p-channel TFT and the semiconductor layer for forming capacitor storage in the driving circuit.

The fourth impurity regions 641 and 642 are doped with an impurity element that gives the p type conductivity in a concentration of $1\times10^{20}$ to $1\times10^{21}$/cm$^3$. The fourth impurity regions 641 and 642 are the regions that are doped with phosphorus (P) in the previous step (n$^-$ region). Now that the fourth impurity regions are doped with an impurity element that gives the p type conductivity in a concentration 1.5 to 3 times the concentration of phosphorus, the conductivity type of the fourth impurity regions is p type. Here, a region having the same concentration range as the fourth impurity regions is called a p$^+$ region.

The fifth impurity regions 643 and 644 are formed in the regions that overlaps the tapered portions of the second conductive layers 125a, and are doped with an impurity element that gives the p type conductivity in a concentration of $1\times10^{18}$ to $1\times10^{20}$/cm$^3$. Here, a region having the same concentration range as the fifth impurity regions is called a p$^-$ region.

Through the above steps, the impurity regions having the n type or p type conductivity are formed in the respective semiconductor layers. The conductive layers 621 to 624 serve as gate electrodes of the TFTs.

Next, an insulating film is formed to cover almost the entire surface. In this embodiment, the insulating film is formed from an inorganic material and is called a first interlayer insulating film 645. Specifically, a silicon nitride film is formed by plasma CVD to a thickness of 100 nm. It is certain that the insulating film is not limited to the silicon nitride film but may be a single layer or laminate of other insulating films containing silicon.

Next, the step of activating the impurity elements used in doping of the semiconductor layers is performed. The activation step is achieved by rapid thermal annealing (RTA) using a lamp light source, or YAG laser or excimer laser irradiation from the back side, or heat treatment using a furnace, or a combination of these methods.

Then heat treatment (at 300 to 550° C. for 1 to 12 hours) is conducted to hydrogenate the semiconductor layers (FIG. 5A). This step is to terminate dangling bonds in the semiconductor layers using hydrogen that is contained in the first interlayer insulating film 645. The semiconductor layers can be hydrogenated irrespective of presence or absence of the gate insulating film 620 that is a silicon oxide film.

On the first interlayer insulating film 645, a second interlayer insulating film 646 is formed from an organic insulating material. In this embodiment, an acrylic film is formed by application to a thickness of 1.0 to 2.0 μm. Acrylic, polyimide, polyamide, polyimideamide, BCB (benzocyclobutene) or the like can be used as an organic insulating material.

By forming the second interlayer insulating film 646 from an organic material, the surface can be leveled well. Organic materials are generally low in dielectric constant and therefore can reduce parasitic capacitance. However, organic materials are hygroscopic and are not suitable to form a protective film. Accordingly, it is preferable to combine an organic insulating film serving as the second interlayer insulating film with a silicon oxide film, silicon oxynitride film, or silicon nitride film that is formed as the first interlayer insulating film 645 as in this embodiment.

On the second interlayer insulating film 646, a third interlayer insulating film 647 is formed from an inorganic material.

The third interlayer insulating film 647 is a silicon nitride film or silicon oxynitride film formed by sputtering. In this embodiment, a silicon nitride film is formed to a thickness of 100 nm. Silicon is employed as the target, and the sputtering gas are $N_2$ and Ar with the gas flow rate ratio thereof set to 20:20 (sccm). To form the film, the pressure is set to 0.4 Pa, the power is set to 800 W, and a circular target with a radius of 6 inches is used. The film formation temperature ranges between room temperature and 200° C. In this embodiment, the film is formed at 200° C.

On the third interlayer insulating film 647, a transparent conductive film 648 transmissive of light is formed. The transparent conductive film 648 is an indium tin oxide (ITO) film, or transparent conductive film obtained by mixing 2 to 20% of zinc oxide (ZnO) with indium oxide, formed by sputtering to a thickness of 110 nm.

After a resist mask is formed on the transparent conductive film 648, the film is etched by wet etching using an acid-based etchant to form a first electrode 649.

With the mask kept in place, the third interlayer insulating film 647 is etched by dry etching. Etching conditions for etching the third interlayer insulating film 647 include using $CF_4$, $O_2$, and He as material gas, setting the gas flow rate ratio thereof to 60:40:35 (sccm), giving an RF (13.56 MHz) power of 400 W to the substrate side (sample stage), and giving an RF (13.56 MHz) power of 450 W to a coiled electrode at a pressure of 53.2 Pa to generate plasma.

Through the above steps, the third interlayer insulating film 647 is etched away except a portion that overlaps the first electrode 649. Thus obtained is the structure shown in FIG. 5C in which the region overlapping the first electrode 649 alone has the third interlayer insulating film 647.

Contact holes reaching source regions or drain regions of the TFTs are formed next. The contact holes are formed by etching the second interlayer insulating film 646, the first interlayer insulating film 645, and the gate insulating film 620 through dry etching under the following conditions.

The second interlayer insulating film 646 is etched first. Etching conditions for etching the second interlayer insulating film 646 include using $CF_4$, $O_2$, and He as material gas, setting the gas flow rate ratio thereof to 5:95:40 (sccm), giving an RF (13.56 MHz) power of 500 W to the substrate side (sample stage), and giving an RF (13.56 MHz) power of 450 W to a coiled electrode at a pressure of 66.5 Pa to generate plasma.

The first interlayer insulating film 645 is etched next. Etching conditions for etching the first interlayer insulating film 645 include using $CF_4$, $O_2$, and He as material gas, setting the gas flow rate ratio thereof to 40:60:35 (sccm), giving an RF (13.56 MHz) power of 400 W to the substrate side (sample stage), and giving an RF (13.56 MHz) power of 450 W to a coiled electrode at a pressure of 40 Pa to generate plasma.

Then the gate insulating film 620 is etched. Etching conditions for etching the gate insulating film 620 include using $CHF_3$ as material gas and setting the gas flow rate ratio thereof to 35 (sccm).

Thereafter, wires are formed from Al, Ti, Mo, W, or the like. Desirably, the electrodes and pixel electrode are formed from materials having excellent reflectance, such as a film mainly containing Al, a film mainly containing Ag, or a laminate of these films. Thus obtained are wires 651 to 658 (FIG. 6A).

Next, a first insulating layer 670 is formed from an organic material. The first insulating layer 670 here is a photosensitive acrylic film. Instead, polyimide, polyamide, acrylic, or BCB (benzocyclobutene) may be used for the first insulating layer.

Specifically, the first insulating layer 670 is obtained by forming a photosensitive acrylic film through spin coating to a thickness of 1.45 μm, patterning the film through photolithography, and etching the film to form an opening so that the opening coincides with the first electrode (anode) 649 (FIG. 6B).

Etching conditions for forming the first insulating layer include using $CF_4$, $O_2$, and He as material gas, setting the gas flow rate ratio thereof to 10:90:40 (sccm), and setting the pressure to 66.5 Pa.

Next, a second insulating layer 671 is formed from an inorganic material. The second insulating layer 671 here is a silicon nitride film. Other materials containing silicon, such as silicon oxide, silicon oxynitride, or SOG, may be used instead.

To be specific, a silicon nitride film is formed by sputtering to a thickness of 100 nm. To form the silicon nitride film, silicon is employed as the target, $N_2$ and Ar are used as material gas, and the gas flow rate ratio thereof is set to 20:20 (sccm). The film formation pressure is set to 0.4 Pa, the power is set to 800 W, and a circular target with a radius of 6 inches is used. The film formation temperature ranges between room temperature and 200° C. In this embodiment, the film is formed at 200° C. The obtained silicon nitride film is patterned by photolithography and then etched to form an opening so that the opening coincides with the first electrode (anode) 649. The second insulating layer 671 is thus formed (FIG. 6B).

Etching conditions for forming the second insulating layer 671 include using $CF_4$, $O_2$, and He as material gas, setting the gas flow rate ratio thereof to 60:40:35 (sccm), and setting the pressure to 53.2 Pa.

Next, an organic compound layer 672 is formed by evaporation on the first electrode (anode) 649 that is exposed in the opening of the second insulating layer 671 (FIG. 6B).

Although only one pixel is shown here, the pixel portion of this embodiment has plural pixels and each pixel has one of three types of organic compound layers: an organic compound layer that emits red light; an organic compound layer that emits green light; and an organic compound layer that emits blue light, to display a full-color image. Combinations of organic compounds for forming these three types of organic compound layers are described with reference to FIGS. 7A to 7D.

A light emitting element shown in FIG. 7A is composed of a first electrode (anode) 701, an organic compound layer 702, and a second electrode (cathode) 703. The organic compound layer 702 has a laminate structure consisting of a hole transporting layer 704, a light emitting layer 705, a blocking layer 706, and an electron transporting layer 707. The second electrode 703 has a cathode buffer layer 708 that is in contact with the organic compound layer 702 (here, the electron transporting layer 707). FIG. 7B shows materials constituting a light emitting element that emits red light and their thicknesses. FIG. 7C shows materials constituting a light emitting element that emits green light and their thicknesses. FIG. 7D shows materials constituting a light emitting element that emits blue light and their thicknesses.

An organic compound layer that emits red light is formed first. Specifically, an organic compound capable of transporting holes is formed into a 40 nm thick film as the hole transporting layer 704 on the first electrode (anode) 701 previously formed. The hole transporting organic compound here is 4, 4'-bis [N-(1-naphthyl)-N-phenyl-amino]-biphenyl (hereinafter referred to as α-NPD). Then 2, 3, 7, 8, 12, 13, 17, 18-octaethyl-21H, 23H-porphyrin-platinum (hereinafter referred to as PtOEP), which is a luminous organic compound, and 4, 4'-dicarbazole-biphenyl (hereinafter referred to as CBP), which is an organic compound that serves as a host (hereinafter referred to as host material) are subjected to co-evaporation to form a 300 nm thick film as the light emitting layer 705. An organic compound capable of blocking carriers, bathocuproin (hereinafter referred to as BCP), is formed into a 10 nm thick film as the blocking layer 706. Then tris (8-quinolinolate) aluminum (hereinafter referred to as Alq$_3$), which is an organic compound capable of transporting electrons, is formed into a 40 nm thick film as the electron transporting layer 707. The organic compound layer that emits red light is thus obtained.

The organic compound layer that emits red light is formed from five kinds of organic compounds having different functions in the case described here. However, the present invention is not limited thereto and known materials can be used to form the organic compound layer that emits red light.

An organic compound layer that emits green light is formed next. Specifically, α-NPD, which is an organic compound capable of transporting holes, is formed into a 40 nm thick film as the hole transporting layer 704 on the first electrode (anode) 701 previously formed. Then CBP as a host material capable of transporting holes and tris (2-phenylpyridium) iridium (hereinafter referred to as Ir(ppy)$_3$), which is a luminous organic compound, are subjected to co-evaporation to form a 300 nm thick film as the light emitting layer 705. An organic compound capable of blocking carriers, BCP, is formed into a 10 nm thick film as the blocking layer 706. Then Alq$_3$, which is an organic compound capable of transporting electrons, is formed into a 40 nm thick film as the electron transporting layer 707. The organic compound layer that emits green light is thus obtained.

The organic compound layer that emits green light is formed from four kinds of organic compounds having different functions in the case described here. However, the present invention is not limited thereto and known materials can be used to form the organic compound layer that emits green light.

An organic compound layer that emits blue light is formed next. Specifically, α-NPD, which is a luminous organic compound capable of transporting holes, is formed into a 40 nm thick film as the light emitting layer 705 on the first electrode (anode) 701 previously formed. An organic compound capable of blocking carriers, BCP, is formed into a 10 nm thick film as the blocking layer 706. Then Alq$_3$, which is an organic compound capable of transporting electrons, is formed into a 40 nm thick film as the electron transporting layer 707. The organic compound layer that emits blue light is thus obtained.

The organic compound layer that emits blue light is formed from three kinds of organic compounds having different functions in the case described here. However, the present invention is not limited thereto and known materials can be used to form the organic compound layer that emits blue light.

By forming the organic compound films shown in the above on first electrode (anode), the pixel portion can have organic compound layers that emit red light, organic compound layers that emit green light, and organic compound layers that emit blue light.

Next, the second electrode (cathode) 673 is formed to cover the organic compound layer 672 and the second insulating layer 671 as shown in FIG. 6C. In this embodiment, the second electrode 673 is desirably formed from a material having a small work function in order to improve injection of electrons. The second electrode (cathode) 673 is a laminate of a cathode buffer layer (not shown in the drawing) that is in contact with the organic compound layer 672 and a conductive film. The cathode buffer layer is formed of calcium fluoride (CaF$_2$) or barium fluoride (BaF$_2$). The conductive film is formed of aluminum. In this embodiment, the second electrode (cathode) 673 is obtained by forming a calcium fluoride film as the cathode buffer layer to a thickness of 1 nm and laying thereon an aluminum film with a thickness of 100 nm.

Other known cathode materials can be used for the second electrode 673 as long as it is a conductive film having a small work function.

In this way, a driving circuit 1705 having an n-channel TFT 1701 and a p-channel TFT 1702 can be formed on the same substrate where a pixel portion 1706 having a switching TFT 1703 that is an n-channel TFT and a current controlling TFT 1704 that is a p-channel TFT is formed (FIG. 6C).

The pixel portion of the light emitting device which is shown in FIG. 1 corresponds to the pixel portion 1706 shown in FIG. 6C. Here, the pixel portion 1706 and the driving circuit 1705 are formed at the same time.

In the pixel portion 1706, the switching TFT 1703 (n-channel TFT) has a channel formation region 503, the first impurity region (n$^-$ region) 638, and the second impurity regions (n$^+$ regions) 635. The first impurity region 638 is formed outside of the conductive layer 623 for forming a gate electrode. One of the second impurity regions 635 serves as a source region and the other serves as a drain region.

The current controlling TFT 1704 (p-channel TFT) of the pixel portion 1706 has a channel formation region 504, the fourth impurity region (n$^-$ region) 644, and the fifth impurity regions (n$^+$ regions) 642. The fourth impurity region 644 is formed outside of the conductive layer 624 for forming a gate electrode. One of the fifth impurity regions 642 serves as a source region and the other serves as a drain region. In the present invention, one of the fifth impurity regions (n$^+$ regions) 642 is electrically connected to the electrode of the light emitting element through the wire 657. The electrode is desirably the anode of the light emitting element since the current controlling TFT 1704 is a p-channel TFT in this embodiment.

In the driving circuit 1705, the n-channel TFT 1701 has a channel formation region 501, the third impurity region (n$^-$ region) 637, and the second impurity regions (n$^+$ regions) 634. The third impurity region 637 partially overlaps the conductive layer 621 for forming a gate electrode with an insulating film sandwiched between the impurity region and the conductive layer. One of the second impurity regions 634 serves as a source region and the other serves as a drain region.

The p-channel TFT 1702 of the driving circuit 1705 has a channel formation region 502, the fifth impurity region (p$^-$ region) 643, and the fourth impurity regions (p$^+$ region) 641. The fifth impurity region 643 partially overlaps the conductive layer 622 for forming a gate electrode with an insulating film sandwiched between the impurity region and the conductive layer. One of the fourth impurity regions 641 serves as a source region and the other serves as a drain region.

By combining the TFTs 1701 and 1702 suitably, a shift register circuit, a buffer circuit, a level shifter circuit, a latch circuit, and the like are formed to build the driving circuit 1705. If a CMOS circuit is to be formed, for example, the n-channel TFT 1701 and the p-channel TFT 1702 are connected complementarily.

For a circuit that gives highest importance to reliability, the n-channel TFT 1701 is suitable because it has a GOLD (Gate-drain Overlapped LDD) structure in which an LDD (Lightly Doped Drain) region overlaps a gate electrode with a gate insulating film interposed therebetween.

The TFTs in the driving circuit 1705 (the n-channel TFT and the p-channel TFT) are required to have high drive performance (ON current: Ion) and to prevent degradation due to the hot carrier effect for improved reliability. Accordingly, this embodiment uses TFTs each having a region (GOLD region) where a gate electrode overlaps a low concentration impurity region with a gate insulating film interposed therebetween as a structure effective in preventing hot carriers from lowering the ON current value.

In contrast, the switching TFT 1703 of the pixel portion 1706 is required to have low OFF current (Ioff). Accordingly, this embodiment uses a TFT having a region (LDD region) where a gate electrode does not overlap a low concentration impurity region with a gate insulating film interposed therebetween as a TFT structure for lowering OFF current.

In the process of manufacturing a light emitting device of this embodiment, the material of a gate electrode is used to form a source signal line and the wire material for forming source and drain electrodes is used to form a gate signal line because of circuit structures and how the manufacture proceeds. However, the electrodes and signal lines can be formed from different materials.

Figure 8A:
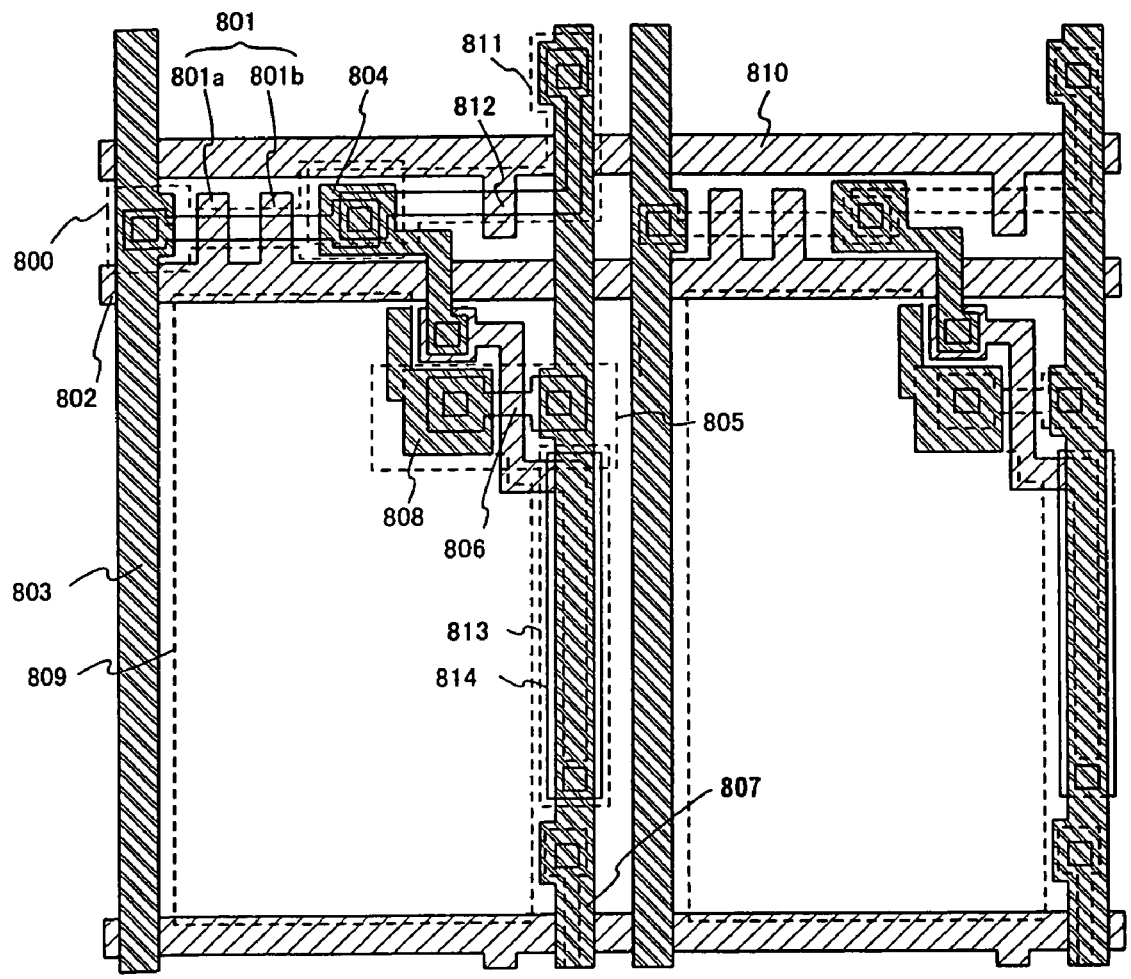
FIGS. 8A and 8B are diagrams illustrating a pixel portion structure that can be used in the present invention.
Figure 8B:
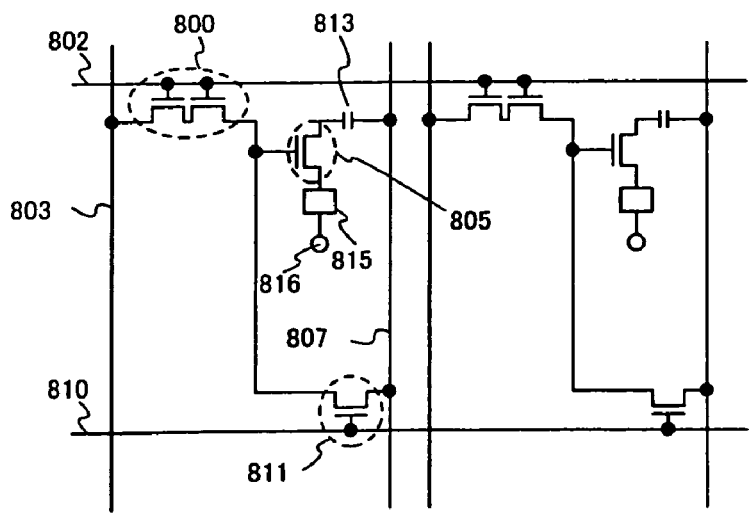

FIG. 8A shows a detailed top structure of the pixel portion of the light emitting device described in this embodiment. A circuit diagram thereof is shown in FIG. 8B. FIGS. 8A and 8B use common symbols and can be cross-referred.

In FIG. 8A, a switching TFT 800 provided on a substrate is the switching (n-channel) TFT 1703 of FIGS. 6A to 6C. For the structure of the switching TFT 800, see the description of the switching (n-channel) TFT 1703. A wire denoted by 802 is a gate wire for electrically connecting gate electrodes 801 (801a and 801b) of the switching TFT 800.

In this embodiment, the TFT has a double gate structure in which two channel formation regions are formed. However, it may take a single gate structure having one channel formation region or a triple gate structure having three channel formation regions.

The source of the switching TFT 800 is connected to a source wire 803, and the drain thereof is connected to a drain wire 804. The drain wire 804 is electrically connected to a gate electrode 806 of a current controlling TFT 805. The current controlling TFT 805 is the current controlling (p-channel) TFT 1704 of FIGS. 6A to 6C. For the structure of the current controlling TFT 805, see the description of the current controlling (p-channel) TFT 1704. The current controlling TFT 805 in this embodiment has a single gate structure, but it may take a double gate structure or a triple gate structure.

The source of the current controlling TFT 805 is electrically connected to a current supply line 807, and the drain thereof is electrically connected to a drain wire 808. The drain wire 808 is electrically connected to a first electrode (anode) 809 indicated by the dotted line.

A wire denoted by 810 is a gate wire electrically connected to a gate electrode 812 of an erasing TFT 811. The source of the erasing TFT 811 is electrically connected to the current supply line 807, and the drain thereof is electrically connected to the drain wire 804.

Manufacture of the erasing TFT 811 is similar to the manufacture of the current controlling (p-channel) TFT 1704 of FIGS. 6A to 6C. For the structure of the erasing TFT 811, see the description of the current controlling (p-channel) TFT 1704. The erasing TFT 811 in this embodiment has a single gate structure, but it may take a double gate structure or a triple gate structure.

Capacitor storage (capacitor) is formed in a region denoted by 813. The capacitor 813 is formed among a semiconductor film 814 that is electrically connected to the current supply line 807, an insulating film (not shown in the drawing) on the same layer as the gate insulating film, and the gate electrode 806. A capacitance formed by the gate electrode 806, the same layer (not shown in the drawing) as the first interlayer insulating film and the second interlayer insulating film, and the current supply line 807 can also be used as capacitor storage.

A light emitting element 815 shown in the circuit diagram of FIG. 8B is composed of a first electrode (anode) 809, an organic compound layer (not shown in the drawing) formed on the first electrode (anode) 809, and a second electrode (cathode) (not shown in the drawing) formed on the organic compound layer. In the present invention, the first electrode (anode) 809 is connected to the source region or drain region of the current controlling TFT 805.

An opposite electric potential is given to the second electrode (cathode) of the light emitting element 815. A power supply electric potential is given to a current supply line V. The difference between the opposite electric potential and the power supply electric potential is always kept at a level large enough to cause the light emitting element to emit light when the anode receives the power supply electric potential. The power supply electric potential and the opposite electric potential are given by power supplies provided by an IC or the like external to the light emitting device of the present invention. The power supply for providing the opposite electric potential is particularly called an opposite power source 816 in this specification.

In this embodiment, the drive voltage of the TFTs is 1.2 to 10 V, preferably 2.5 to 5.5 v.

When an animation is displayed, the background image is formed by pixels whose light emitting elements are emitting light whereas texts are displayed by pixels whose light emitting elements are not emitting light. When an animation displayed is still for more than a given period (called stand-by in this specification), the display method is switched (inverted) to save power. Specifically, texts are displayed by pixels whose light emitting elements are emitting light (also called text display) whereas the background image is formed by pixels whose light emitting elements are not emitting light (also called background display).

Embodiment 3

This embodiment describes with reference to FIGS. 9A and 9B the exterior of an active matrix light emitting device of the present invention. FIG. 9A is a top view of the light emitting device, and FIG. 9B is a sectional view taken along the line A–A' in FIG. 9A. Regions 901, 902, and 903 indicated by dotted lines are a source signal line driving circuit, a pixel portion, and a gate signal line driving circuit, respectively. Denoted by 904 is a sealing substrate and 905 denotes a seal agent. The seal agent 905 surrounds a space 907.

Denoted by 908 is a wire for sending signals to be inputted to the source signal line driving circuit 901 and the gate signal line driving circuit 903. The wire 908 receives a video signal and a clock signal from an FPC (flexible printed circuit) 909 that serves as an external input terminal. Although the FPC alone is shown here, a printed wire board (PWB) may be attached to the FPC. In this specification, a light emitting device includes a light emitting device itself plus an FPC and/or PWB attached thereto.

Referring to FIG. 9B, the sectional structure is described next. Driving circuits and a pixel portion are formed on a substrate 910. However, FIG. 9B only show the source signal line driving circuit 901 as a driving circuit and the pixel portion 902.

The source signal line driving circuit 901 is a CMOS circuit that is a combination of an n-channel TFT 913 and a p-channel TFT 914. TFTs constituting the driving circuits may form a known CMOS circuit, PMOS circuit, or NMOS circuit. The light emitting device shown in this embodiment is a driver-integrated type in which driving circuits are formed on a substrate. However, driving circuits are not necessarily formed on a substrate and they may be external to the substrate.

The pixel portion 902 is composed of a plurality of pixels. Each pixel includes a current controlling TFT 911 and a first electrode (anode) 912 that is electrically connected to the drain of the current controlling TFT 911.

Insulating layers 913 is formed at both ends of the first electrode (anode) 912. An organic compound layer 914 is formed on the first electrode (anode) 912. A second electrode (cathode) 916 is formed on the organic compound layer 914. In this way, a light emitting element 918 composed of the first electrode (anode) 912, the organic compound layer 914, and the second electrode (cathode) 916 is formed.

The second electrode (cathode) 916 also functions as a wire common to all pixels, and is electrically connected to an FPC 909 through a connection wire 908.

The sealing substrate 904 is bonded by the seal agent 905 in order to seal the light emitting element 918 formed on the substrate 910. A spacer formed from a resin film may be provided to keep the gap between the sealing substrate 904 and the light emitting element 918. The space 907 inside the seal agent 905 is filled with inert gas such as nitride. The seal agent 905 is preferably an epoxy-based resin. It is also desirable to use as the seal agent 905 a material that allows as little moisture and oxygen as possible to transmit. A substance having an effect of absorbing oxygen and water may be put in the space 907.

The sealing substrate 904 in this embodiment can be a glass substrate or a quartz substrate. In addition, a plastic substrate formed of FRP (Fiberglass-Reinforced Plastics), PVF (polyvinyl fluoride), Mylar, polyester, acrylic, etc. can be used as the sealing substrate. After the sealing substrate 904 is bonded using the seal agent 905, more seal agent may be used so as to cover the side faces (exposed faces) for sealing.

By sealing the light emitting element in the space 907 as described above, the light emitting element is completely cut off from the outside and external substances that accelerate degradation of the organic compound layer, such as moisture and oxygen, can be prevented from entering the element. Accordingly, a highly reliable light emitting device can be obtained.

The structure of this embodiment can be combined freely with any structures shown in Embodiments 1 and 2.

Embodiment 4

Light emitting devices using light emitting elements are self-luminous and therefore have better visibility in bright surroundings and wider view than liquid crystal display devices. Accordingly, a light emitting device of the present invention can be used to obtain various electric appliances. Examples of electronic appliance manufactured using the light emitting devices formed with the present invention include, video cameras, digital cameras, goggle type displays (head mounted displays), navigation systems, audio reproducing devices (car audios, and audio components, etc.), notebook computers, game machines, portable information terminals (mobile computers, mobile telephones, mobile type game machines, and electronic book devices, etc.), image reproducing devices equipped with a recording medium (specifically digital video disks (DVDs), etc. that reproduces the recording medium and devices equipped with a display device that displays the image) and the like. In particular, as to the portable information terminals, there is a lot of an opportunity to look at the screen from a diagonal direction. Then, as the extent of angle of visibility is regarded as important, a light emitting device with a light emitting element is desirably used. Examples of these electronic appliances are specifically shown in FIG. 10.

Figure 10A:
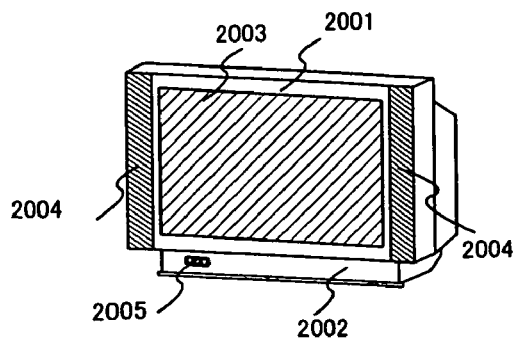
FIGS. 10A to 10H are diagrams showing examples of an electronic appliance.

FIG. 10A is a display device, which is composed of a frame 2001, a support base 2002, a display unit 2003, a speaker portion 2004, a video input terminal 2005, and the like. The light emitting device manufactured by the present invention is used for the display unit 2003 to be manufactured. Light emitting devices with light emitting elements are self-luminous and therefore do not need a backlight, thereby making it possible to obtain a thinner display unit than that of a liquid crystal display device. The term display device includes all the display devices for displaying information, such as personal computer monitors, display devices for receiving TV broadcasting, and display devices for advertising.

Figure 10B:
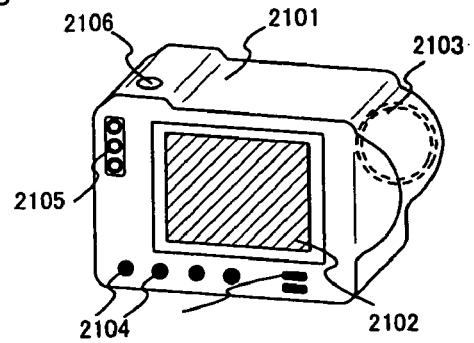

FIG. 10B is a digital still camera, which is composed of a main body 2101, a display unit 2102, an image-receiving portion 2103, operation keys 2104, an external connection port 2105, a shutter 2106, and the like. The light emitting device manufactured by the present invention is used for the display unit 2102 to be manufactured.

Figure 10C:
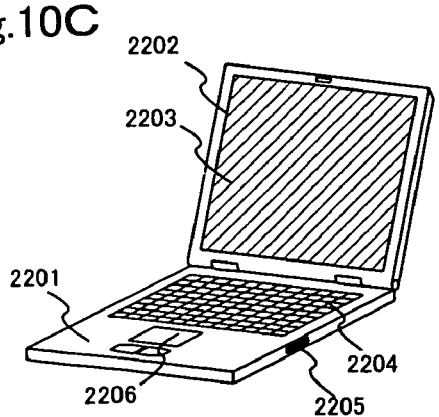

FIG. 10C is a notebook type personal computer, which is composed of a main body 2201, a frame 2202, a display unit 2203, a keyboard 2204, an external connection port 2205, a pointing mouse 2206, and the like. The light emitting device manufactured by the present invention is used for the display unit 2203 to be manufactured.

Figure 10D:
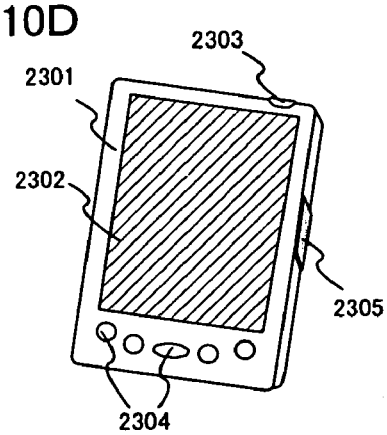

FIG. 10D is a mobile computer, which is composed of a main body 2301, a display unit 2302, a switch 2303, operation keys 2304, an infrared port 2305, and the like. The light emitting device manufactured by the present invention is used for the display unit 2302 to be manufactured.

Figure 10E:
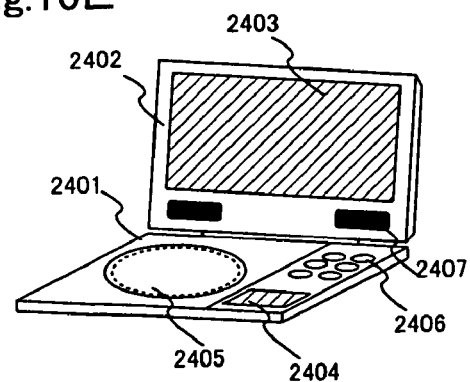

FIG. 10E is a portable image reproducing device provided with a recording medium (specifically, a DVD reproducing device), which is composed of a main body 2401, a frame 2402, a display unit A 2403, a display unit B 2404, a recording medium (such as a DVD) read-in portion 2405, operation keys 2406, a speaker portion 2407, and the like. The display unit A 2403 mainly displays image information, and the display unit B 2404 mainly displays character information, and the light emitting device manufactured by the present invention is used for the display unit A 2403 and display unit B 2404 to be manufactured. Note that family game machines and the like are included in the category of image reproducing devices provided with a recording medium.

Figure 10F:
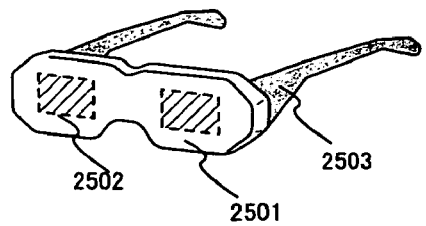

FIG. 10F is a goggle type display (head mounted display), which is composed of a main body 2501, a display unit 2502, an arm portion 2503, and the like. The light emitting device manufactured by the present invention is used for the display unit 2502 to be manufactured.

Figure 10G:
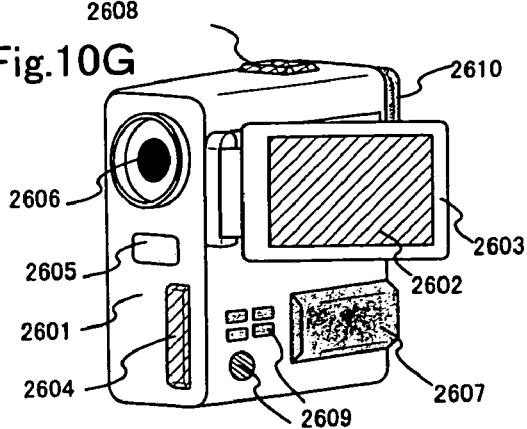

FIG. 10G is a video camera, which is composed of a main body 2601, a display unit 2602, a frame 2603, an external connection port 2604, a remote control receiving portion 2605, an image receiving portion 2606, a battery 2607, an audio input portion 2608, operation keys 2609, an eyepiece portion 2610, and the like. The light emitting device manufactured by the present invention is used for the display unit 2602 to be manufactured.

Figure 10H:
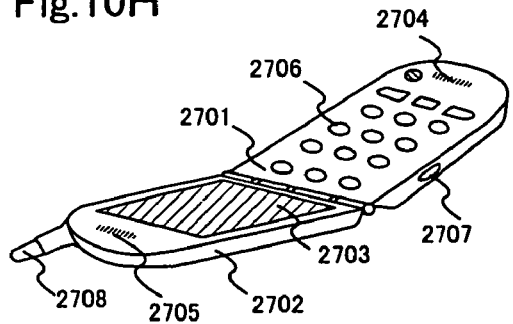

FIG. 10H is a mobile telephone, which is composed of a main body 2701, a frame 2702, a display unit 2703, an audio input portion 2704, an audio output portion 2705, operation keys 2706, an external connection port 2707, an antenna 2708, and the like. The light emitting device manufactured by the present invention is produced for the display unit 2703 to be manufactured. Note that white characters are displayed on a black background, whereby the display unit 2703 can suppress the power consumption of the mobile telephone.

Note that if the light emitting luminance of the organic material increases in the future, the expanding projection of the light included in the outputted image information is performed with a lens or the like, whereby it is possible to use the projected light in front type projectors or read type projectors.

Electric appliances as those described above now increasingly display information distributed through electronic communication lines such as Internet and CATV (cable television), particularly animation information. Since organic materials have very fast response, light emitting devices are preferably in displaying animation.

In a light emitting device, areas that are emitting light consume power and therefore information is preferably displayed in a manner that makes as small areas as possible to emit light. It is therefore preferable to use portions that are not emitting light for the background and portions that are emitting light for text information when a light emitting device is used as a display unit of a portable information terminal, particularly, cellular phone and an audio reproducing device where mainly text information is displayed.

As described, the application range of a light emitting device manufactured in accordance with a manufacturing method of the present invention is so wide that the light emitting device of the present invention can be used in electric appliances of any field. The electric appliances of this embodiment can be obtained by using light emitting devices that are manufactured in accordance with Embodiments 1 through 3.

In the present invention, a film formed of an organic material and a film formed of an inorganic material are layered to form an interlayer insulating film. The obtained interlayer insulating film has both a characteristic of an inorganic material which does not allow oxygen and moisture to transmit and a characteristic of an organic material which makes it possible to form a thick film and level the surface well. This way a light emitting element can be protected against oxygen and moisture and therefore degradation of the light emitting element can be prevented.

In a light emitting device of the present invention, a contact hole is formed where a film formed of an organic material has been removed. Therefore, the problem accompanying forming a contact hole where a film formed of an organic material is present can be solved.

What is claimed is:

1. A method of manufacturing a light emitting device, comprising:
  forming a thin film transistor on an insulating surface;
  forming a first insulating film comprising an inorganic material over the thin film transistor;
  forming a second insulating film comprising an organic material over the first insulating film by application;
  forming a third insulating film comprising an inorganic material over the second insulating film by sputtering;
  forming a conducting film over the third insulating film, the conductive film serving as a first electrode of a light emitting element;
  forming the first electrode from the conductive film by first etching using a mask;
  pattering the third insulating film by second etching to form a patterned third insulating film, thereby exposing portion of the second insulating film;
  forming a contact hole in the first insulating film, the second insulating film, and a gate insulating film of the thin film transistor wherein the contact hole is located in the exposed portion of the second insulating film;
  forming a wire in the contact hole wherein the wire is brought into contact with the thin film transistor and the first electrode;
  forming an organic compound layer over the first electrode; and
  forming a second electrode of the light emitting element over the organic compound layer.

2. A method of manufacturing a light emitting device, comprising:
  forming a thin film transistor on an insulating surface;
  forming a first insulating film comprising an inorganic material over the thin film transistor;
  forming a second insulating film comprising an organic material over the first insulating film by application;
  forming a third insulating film comprising an inorganic material over the second insulating film by sputtering;
  forming a conducting film over the third insulating film, the conductive film serving as a first electrode of a light emitting element;
  forming the first electrode from the conductive film by wet etching using a mask; and
  pattering the third insulating film by dry etching to form a patterned third insulating film, thereby exposing portion of the second insulating film.

3. A method of manufacturing a light emitting device, comprising:
  forming a thin film transistor on an insulating surface;
  forming a first insulating film comprising an inorganic material over the thin film transistor;
  forming a second insulating film comprising an organic material over the first insulating film by application;
  forming a third insulating film comprising an inorganic material over the second insulating film by sputtering;
  forming a conducting film over the third insulating film, the conductive film serving as a first electrode of a light emitting element;
  forming the first electrode from the conductive film by wet etching using a mask;
  pattering the third insulating film by dry etching to form a patterned third insulating film, thereby exposing portion of the second insulating film;
  forming a contact hole in the first insulating film, the second insulating film, and a gate insulating film of the thin film transistor wherein the contact hole is located in the exposed portion of the second insulating film;
  forming a wire in the contact hole wherein the wire is brought into contact with the thin film transistor and the first electrode;
  forming an organic compound layer over the first electrode; and forming a second electrode over the organic compound layer.

4. A method of manufacturing a light emitting device according to claim 1, wherein the interlayer insulating film is formed by sputtering.

5. A method of manufacturing a light emitting device according to claim 2, wherein the interlayer insulating film is formed by sputtering.

6. A method of manufacturing a light emitting device according to claim 3, wherein the interlayer insulating film is formed by sputtering.

7. A method of manufacturing a light emitting device according to claim 1,
wherein the film formed from an inorganic material by sputtering uses silicon as the target and gas containing noble gas and nitrogen, and
wherein the silicon content ratio of the film is 25.0 atomic % or higher and 35.0 atomic % or lower and the nitrogen content ratio thereof is 35.0 atomic % or higher and 65.0 atomic % or lower.

8. A method of manufacturing a light emitting device according to claim 2,
wherein the film formed from an inorganic material by sputtering uses silicon as the target and gas containing noble gas and nitrogen, and
wherein the silicon content ratio of the film is 25.0 atomic % or higher and 35.0 atomic % or lower and the nitrogen content ratio thereof is 35.0 atomic % or higher and 65.0 atomic % or lower.

9. A method of manufacturing a light emitting device according to claim 3,
wherein the film formed from an inorganic material by sputtering uses silicon as the target and gas containing noble gas and nitrogen, and
wherein the silicon content ratio of the film is 25.0 atomic % or higher and 35.0 atomic % or lower and the nitrogen content ratio thereof is 35.0 atomic % or higher and 65.0 atomic % or lower.

10. A method of manufacturing a light emitting device according to claim 4,
wherein the film formed from an inorganic material by sputtering uses silicon as the target and gas containing noble gas and nitrogen, and
wherein the silicon content ratio of the film is 25.0 atomic % or higher and 35.0 atomic % or lower and the nitrogen content ratio thereof is 35.0 atomic % or higher and 65.0 atomic % or lower.

11. A method of manufacturing a light emitting device according to claim 5,
wherein the film formed from an inorganic material by sputtering uses silicon as the target and gas containing noble gas and nitrogen, and
wherein the silicon content ratio of the film is 25.0 atomic % or higher and 35.0 atomic % or lower and the nitrogen content ratio thereof is 35.0 atomic % or higher and 65.0 atomic % or lower.

12. A method of manufacturing a light emitting device according to claim 6,
wherein the film formed from an inorganic material by sputtering uses silicon as the target and gas containing noble gas and nitrogen, and
wherein the silicon content ratio of the film is 25.0 atomic % or higher and 35.0 atomic % or lower and the nitrogen content ratio thereof is 35.0 atomic % or higher and 65.0 atomic % or lower.

* * * * *